US 6,621,270 B2

(12) United States Patent
Johnson et al.

(10) Patent No.: US 6,621,270 B2
(45) Date of Patent: Sep. 16, 2003

(54) METHOD AND APPARATUS FOR AUTOMATED RELAY TESTING

(75) Inventors: Alan Glen Johnson, Raleigh, NC (US); Frederic Thomas Cuddy, Fayetteville, NC (US); Phillip Morris Douglas, Clayton, NC (US)

(73) Assignee: Santronics, Inc., Sanford, NC (US)

( * ) Notice: Subject to any disclaimer, the term of this patent is extended or adjusted under 35 U.S.C. 154(b) by 23 days.

(21) Appl. No.: 10/045,555

(22) Filed: Jan. 11, 2002

(65) Prior Publication Data

US 2003/0132752 A1 Jul. 17, 2003

(51) Int. Cl.$^7$ ............................................. G01R 31/02
(52) U.S. Cl. ...................................... 324/418; 324/422
(58) Field of Search ............................. 702/57, 64, 65, 702/115, 117, 122, 124, 183, 185, 188, FOR 103–106, 111, 134, 135, 170, 171; 324/418, 420, 421, 422, 424, 503, 504; 361/160, 166, 172

(56) References Cited

U.S. PATENT DOCUMENTS 4,319,193 A * 3/1982 Boccali et al. .............. 324/418
5,256,973 A * 10/1993 Thee et al. .................. 324/418

* cited by examiner

Primary Examiner—N. Le
Assistant Examiner—Vincent Q. Nguyen
(74) Attorney, Agent, or Firm—Moore & Van Allen PLLC; William G. Dosse

(57) ABSTRACT

In order to assist persons of limited skill or time to test electromechanical or other relays without the need for VOM testing and time-consuming test setup, switching circuits, current sources are used in an automated test set with a stored program which tests the impedance between each terminal of the relay and every other terminal of the relay, identifies the terminals for the relay coil and for the relay's contact terminals and whether the contacts are NO, NC, or double throw type. The test set notes the presence or absence of a coil-suppression device across the coil, repetitively tests operation of the contacts, and informs the human operator, in simple terms, if the relay is operable and safe for use with delicate drive circuits.

35 Claims, 15 Drawing Sheets

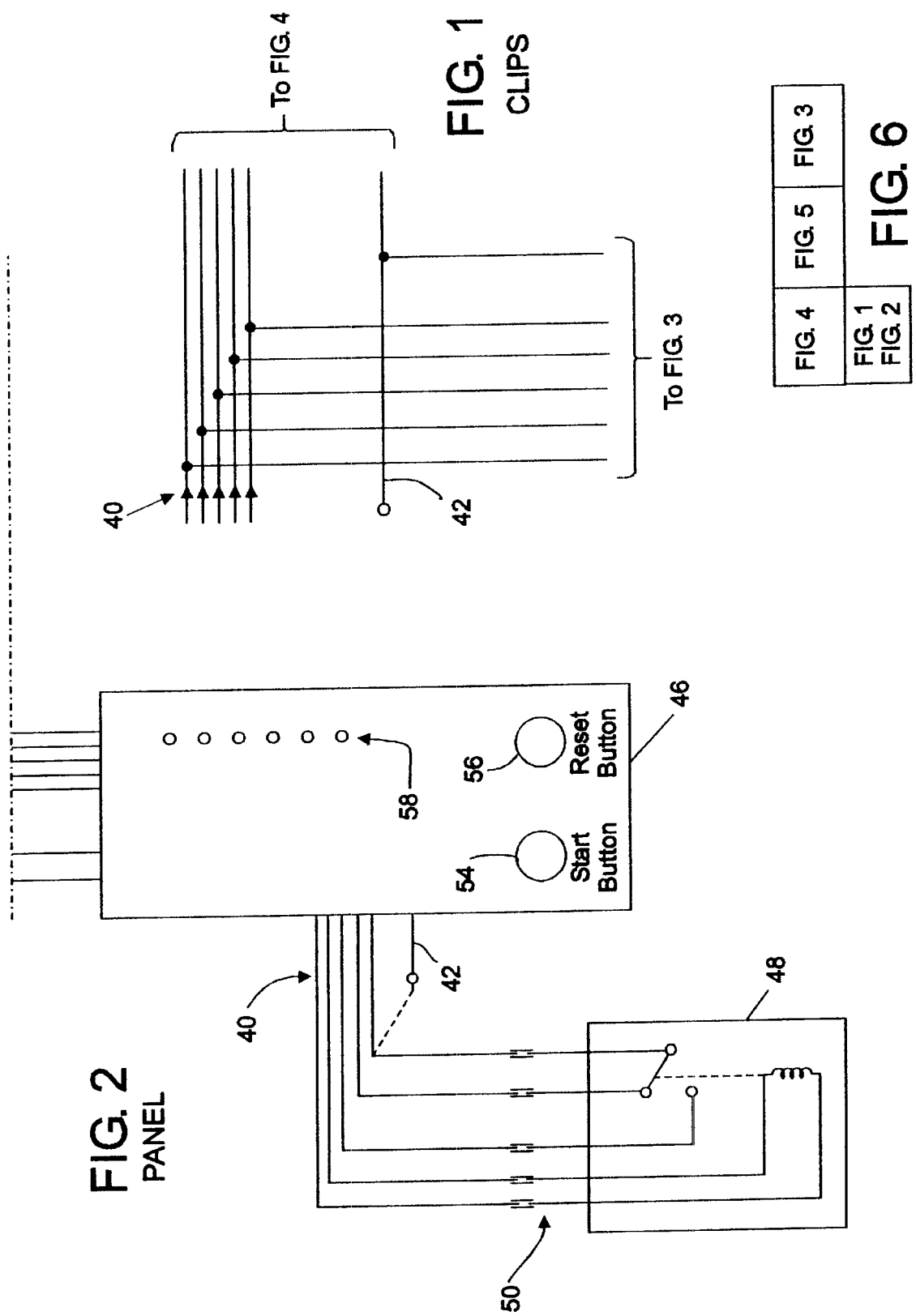

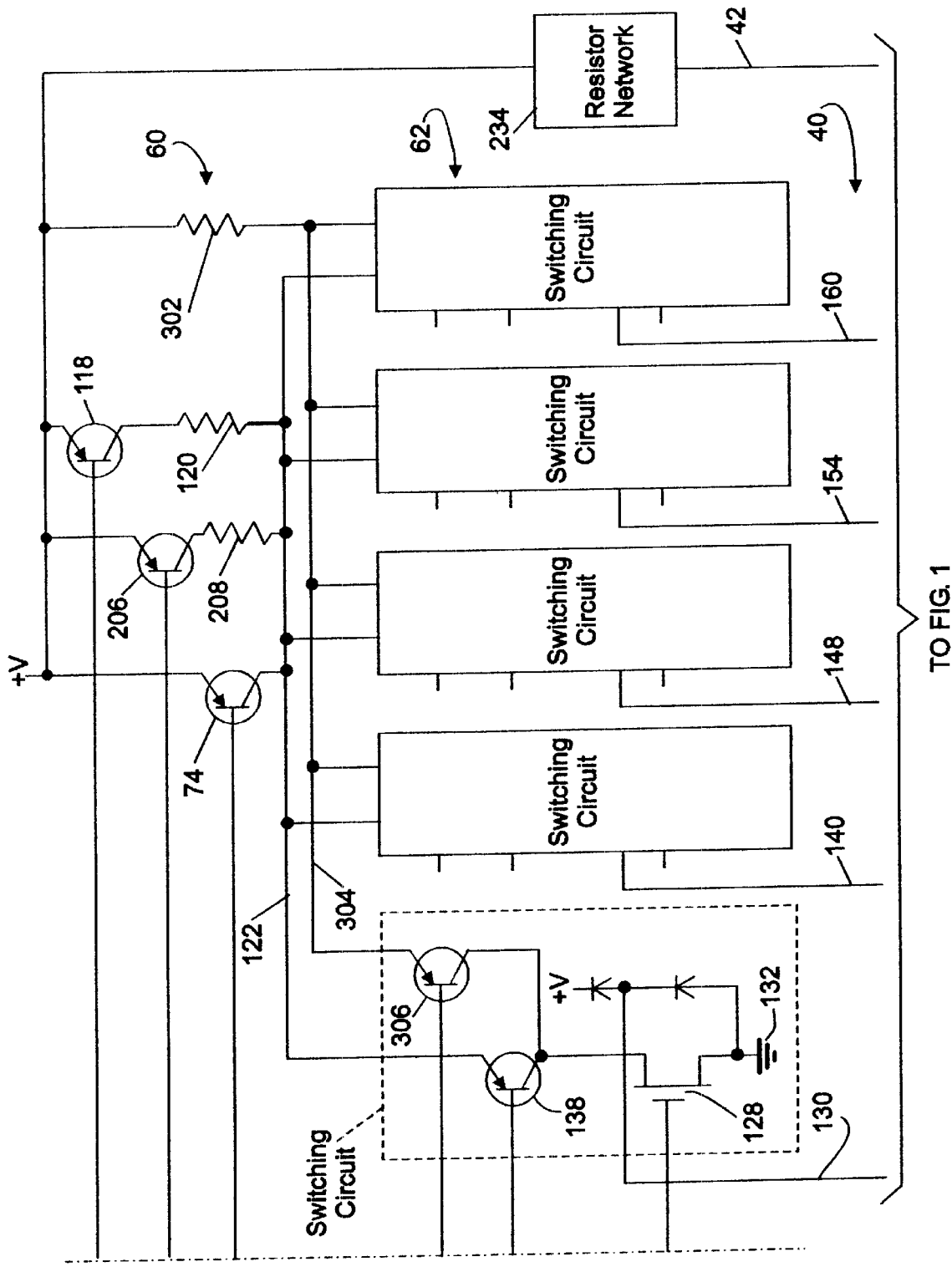

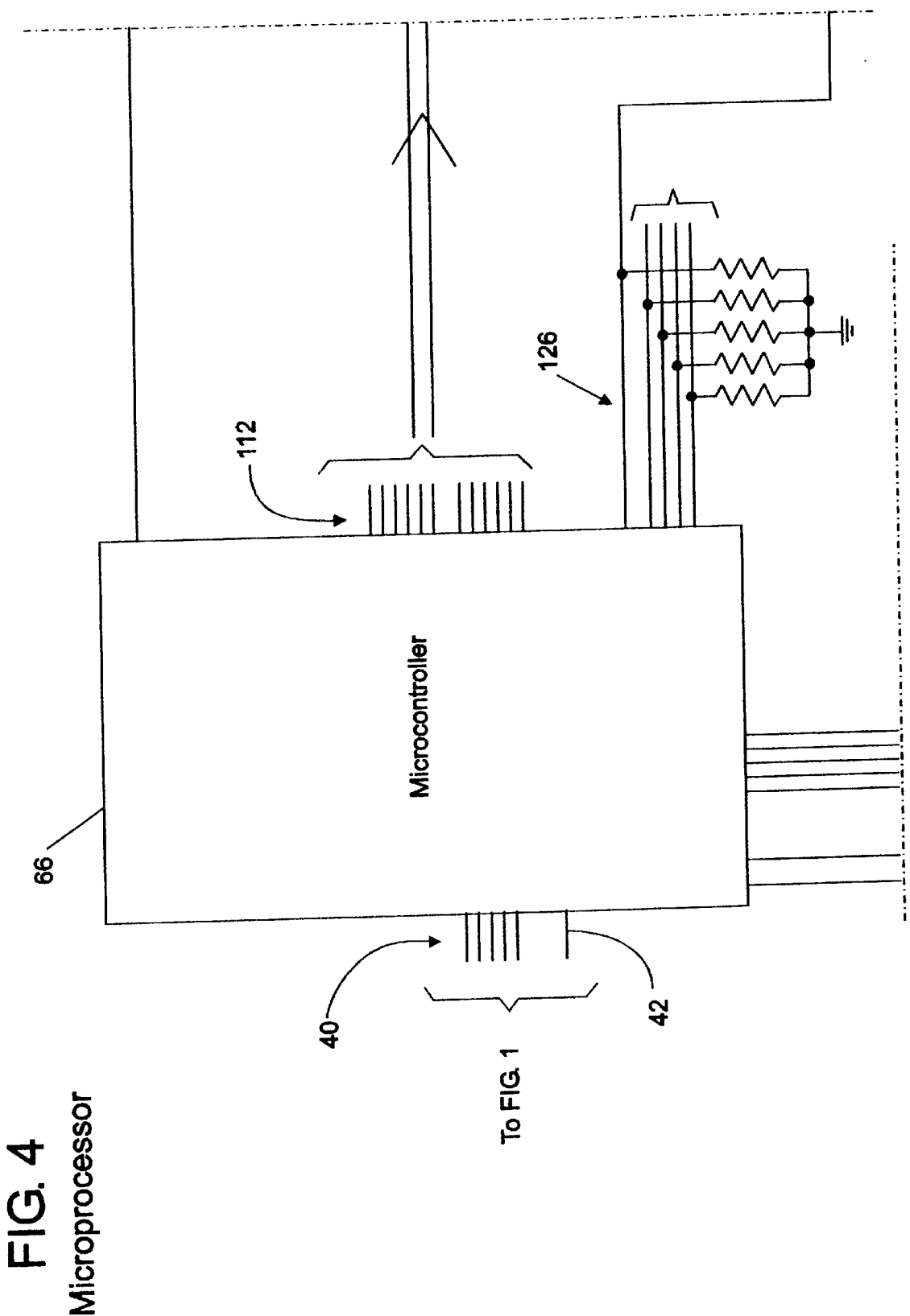

AMPS

METHOD AND APPARATUS FOR AUTOMATED RELAY TESTING

FIELD OF THE INVENTION

The present invention relates to a method and apparatus for automated testing of relays and more particularly to automatically ascertaining which terminals of the relay are connected to a relay coil and which terminals of the relay are connected to the relay contacts, and then to automatically testing and reporting the functional parameters of the relay.

BACKGROUND OF THE INVENTION

The need to test the operating parameters of relays has been around almost since the invention of the telegraph. Traditionally, relay function parameters have been tested by skilled electrical technicians who understood the construction and operation of the relay coils, armatures, and solid metallic contacts.

However, in recent years electronic and electromechanical controls have invaded many predominately mechanical product fields. For example, many modern automobiles contain at least half a dozen microprocessors to control a large variety of hitherto purely mechanical processes.

Automobiles are still basically low-voltage products, operating primarily at twelve volts DC (12VDC). Therefore, supplying even a modest amount of power at that low voltage can involve switching a substantial magnitude of electrical current. However, control of some of these processes requires operating power far in excess than that which can be supplied directly at the output of a microprocessor. Also, many of those high-power processes can produce a substantial inductive "kick" when electrical power is removed from them. Therefore, a more-or-less convention relay with a coil and solid metallic contacts is the only economically-viable solution.

However, like the automobile, many kinds of traditionally mechanical equipment are still repaired and maintained by mechanical craftsmen with little appreciation of the nicities of electromechanical devices or time to perform careful manual tests of such devices. Also, when performing a mechanical repair involving an element of electromechanical control, there may be temptation to replace relays rather than take the time to perform careful tests of them by manual means. This is especially true with the increasing use of plug-in mounting of relays, which requires no unsoldering or other time-intensive disassembly in order to remove the relay.

In recent years electronic devices have been designed and manufactured to perform the traditional functions of relays. These are often even more tedious to test manually.

Therefore, it is an object of the present invention to enable a mechanic, unskilled in the intricacies of relay construction and operation, to test a relay easily and quickly. To that end, a mechanic wishing to test the functional parameters of a relay should not have to use a volt-ohm meter (VOM) to ascertain which of the relay's terminals are connected to the electromagnetic coil that operates the armature of the relay. Also, the mechanic should not have to use a VOM in order to determine the presence and polarity of any coil-suppression diode or resistance network that might be connected across the coil terminals of the relay. Also, a VOM should not have to be used to ascertain if the relay contacts are normally closed (NC), normally open (NO), or single pole, double throw (SPDT)

SUMMARY OF THE INVENTION

According to one aspect of the present invention, a program-controlled microprocessor ascertains the impedance between each terminal of the relay and every other terminal of the relay. In this way, the microprocessor determines which are the coil terminals, which are the contact terminals, and the de-energized condition of the contacts. The microprocessor also determines whether or not there is a coil-suppressor diode or resistance network and the polarity of a diode, if present, and if the diode is in good condition. The microprocessor then applies current to the relay coil, in the proper polarity, and examines the action and condition of the contacts. The microprocessor then indicates to the operator the condition of the various parts of the relay, as ascertained in the test.

The various objects, features, and advantages of the present invention will be readily apparent from the following specification and drawings.

BRIEF DESCRIPTION OF THE INVENTION

A more complete understanding of the present invention will be had from the following detailed description when considered in connection with the accompanying drawings, wherein the same reference numbers refer to the same or corresponding items shown throughout the several figures, in which:

FIG. 1 shows a schematic representation of the initial wiring of the relay test set from the alligator clip leads and a test terminal for connection of a clip lead that is not used for a particular type of relay;

FIG. 2 is an illustration of how the operator's panel of the relay test set might appear, showing output lamps, a "start" or "test" button and a "reset" button;

FIG. 3 is a schematic diagram of a transistorized switching network for applying electrical current signals to the clip leads and thus to the terminals of the relay under test and for sampling voltage levels at each of the clip leads;

FIG. 4 shows a microprocessor integrated circuit package with its various signal connections to the other portions of the circuit;

FIG. 6 is an illustration of how the first four sheets of drawings are to be arranged to illustrate some of the interconnections between them;

DETAILED DESCRIPTION AND PRACTICAL APPLICATION OF THE PREFERRED EMBODIMENT

Figure 5:
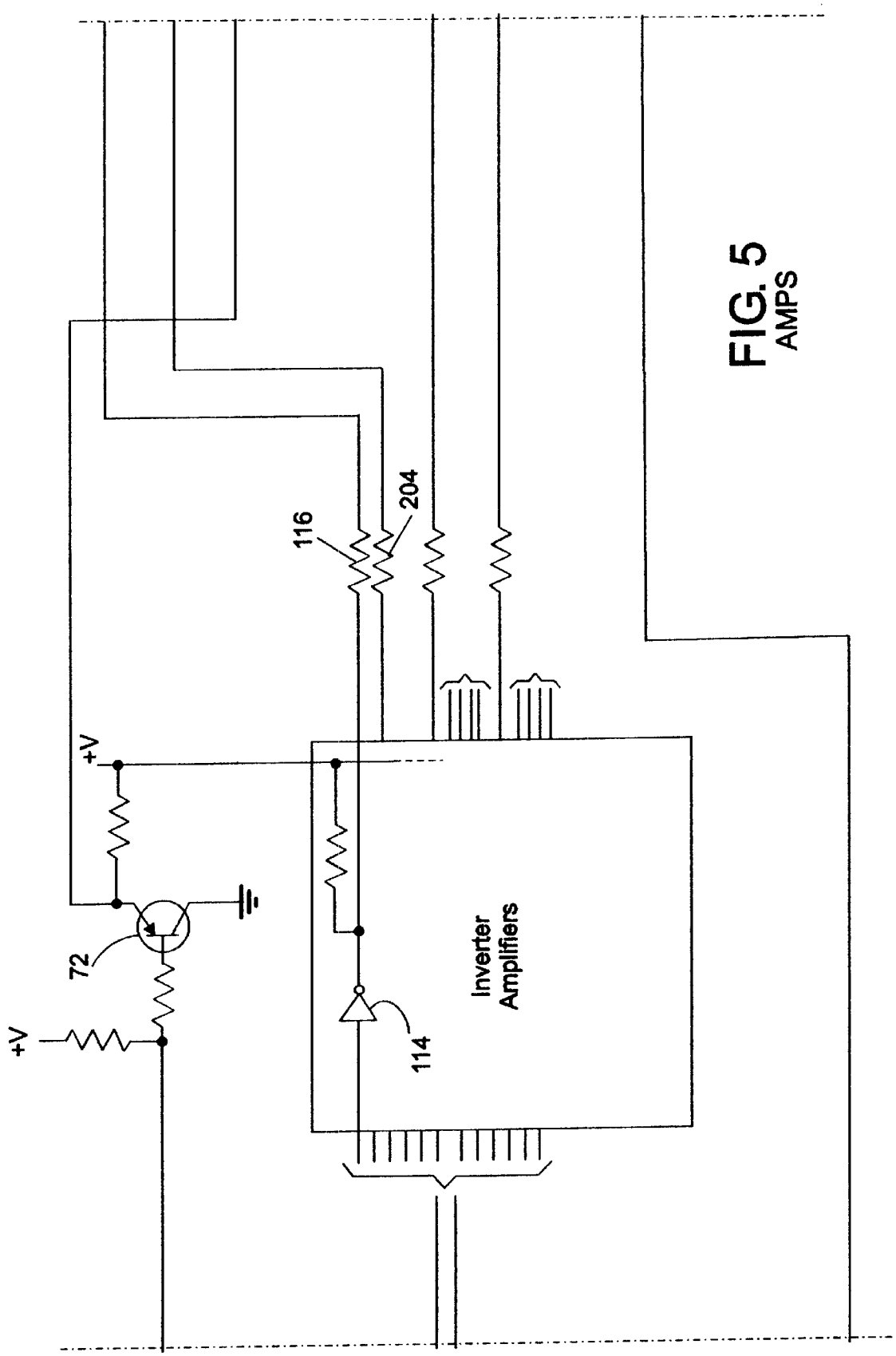
FIG. 5 shows a multiple-amplifier network for adjusting signal voltage level and polarity between the microprocessor of FIG. 4 and the switching network of FIG. 3.

Referring now to the drawings and more particularly to FIG. 1, there is shown simple wiring diagram showing five test leads 40, each test lead terminated in a conventional alligator clip. Another keeper lead 42 is terminated in a simple electrical connector. The remainder of FIG. 1 is used to illustrate how the test leads 40 and the keeper lead 42 are connected to other parts of the exemplary circuit of the preferred embodiment of the present invention.

FIG. 2 shows a schematic representation of a relay test set 46 of he preferred embodiment. The alligator clips at the ends of the test leads 40 a schematically shown connected to a schematic representation of a relay 48, under test. The relay 48 has a plurality of terminals 50, which are preferably four or five in number, depending upon the contact arrangement of the relay. If the relay has a two-terminal coil and either normally-open contacts or normally-closed contacts, the relay will, most likely, have four terminals. However, if the relay 48 has single-pole, double-throw contacts—sometimes called transfer contacts—it will have a common terminal and a normally-closed terminal and a normally open terminal and will have a total of five external terminals.

In the case of a five-terminal relay, each of the five alligator-clip-equipped test leads 40 will be connected to a different one of the five terminals of the relay. In the case of a relay with only four terminals, the fifth test lead will be connected to the keeper lead 42.

When a mechanic unplugs a relay from its service location, for example, under the hood of an automobile, the mechanic will connect one of the clip leads 40 to each terminal of the relay 48. In the case of a four-terminal relay, the mechanic clips the fifth test lead to the keeper 42.

The advantage of the present invention, as implemented in the present preferred embodiment thereof, is that the mechanic need not be concerned with which terminals are connected to the operating coil of the relay and which terminals are connected to the contacts of the relay. The present invention obviates such concerns, as will be appreciated upon consideration of the herein-described preferred embodiment of the invention.

Overview of the Test Circuit

FIGS. 3, 4, and 5, like FIG. 1 show circuits and components that are all contained within the test set 46, even though some lines are illustrated as being connected from FIG. 3 to FIG. 2. The mechanic who operates the test set of the present preferred embodiment will see only a minimum of controls and informational outputs. Besides the five test leads 40 and the keeper 42, the test set 46 of the preferred embodiment has a start button 54, to begin testing the relay 48 after the test leads 40 have been connected. There is preferably a reset button 56, case something goes wrong during the test process. There will also be a power input cord and plug for supplying electrical power to the relay test set 46. However, the power supply for the test set can, for example, be simple household alternating current or a DC primary or secondary battery and is conventional and forms no part of the present invention. Therefore, electrical power has been assumed and all electrical power sources have been omitted from the present description and drawings, for simplicity.

The relay test set 46 also has readout devices to indicate to the operator the results of the testing of the relay 48.

The readout devices need be no more than a plurality of light-emitting diodes (LEDs) 58. These are to indicate to the mechanic, as simply as possible, the results of the test of the relay. The LED readouts can be so simple, that a full explanation can be printed on the front plate of the test set, next to the LEDs.

FIG. 3 is a schematic illustration of current-source circuits 60 and associated switching circuits 62 which switch the five test leads 40, alternatively, between a positive current source and a common ground potential return. Each one of the switching circuits 62 is associated with a different one of the test leads 40. The five switching circuits 62 are identical. Therefore, only one switching circuit has-been shown, schematically, in detail. The current-source circuits 60 and the details of the switching circuits 62 will be explained below, in connection with the description of the exemplary preferred embodiment of the software used to operate the relay test set 46.

FIG. 4 is dominated by a microcontroller 66. The nicrocontroller is a commercial product sold by Microchip Technology, Inc., Chandler, Ariz., under the product code PIC16F74. In contains all of the logic, memory, and driver components necessary to be a stored-program controller of a generalized piece of equipment, including a CPU, program storage, SRAM, and full I/O drivers.

FIG. 5 is dominated by a set of twelve inverting amplifiers 70, one of which will be explained in greater detail in connection with an appropriate step in the explanation of the preferred embodiment of the software to operate the relay test set. While a single set of twelve inverting amplifiers 70 is shown in FIG. 5, it is actually comprised of two integrated-circuit packages. Each integrated-circuit (IC) package is called a hex inverter with open-collector output. The hex inverter IC is an industry-standard part known by the designation 74LC06 and has been widely manufactured and sold by several semiconductor companies.

The inverting amplifiers 70 accept the twelve of the outputs of the microcontroller 66 and drive twelve of the switching transistors of the current-source circuits 60 and the switching circuits 62. The operation of an exemplary one of the inverting amplifiers will be explained in greater detail below, in connection with the explanation of an appropriate portion of the software.

FIG. 5 also shown an emitter-follower amplifier transistor 72 which accepts a low-level signal from one of the outputs of the microcontroller 66 and drives a high-current transistor switch 74. The operation of the emitter follower transistor 72 and the high-current transistor switch 74 will be described in greater detail in connection with the description of that portion of the software that relates to the actuation of the relay coil for testing the contacts of the relay.

Overview of the Software

Figure 7:
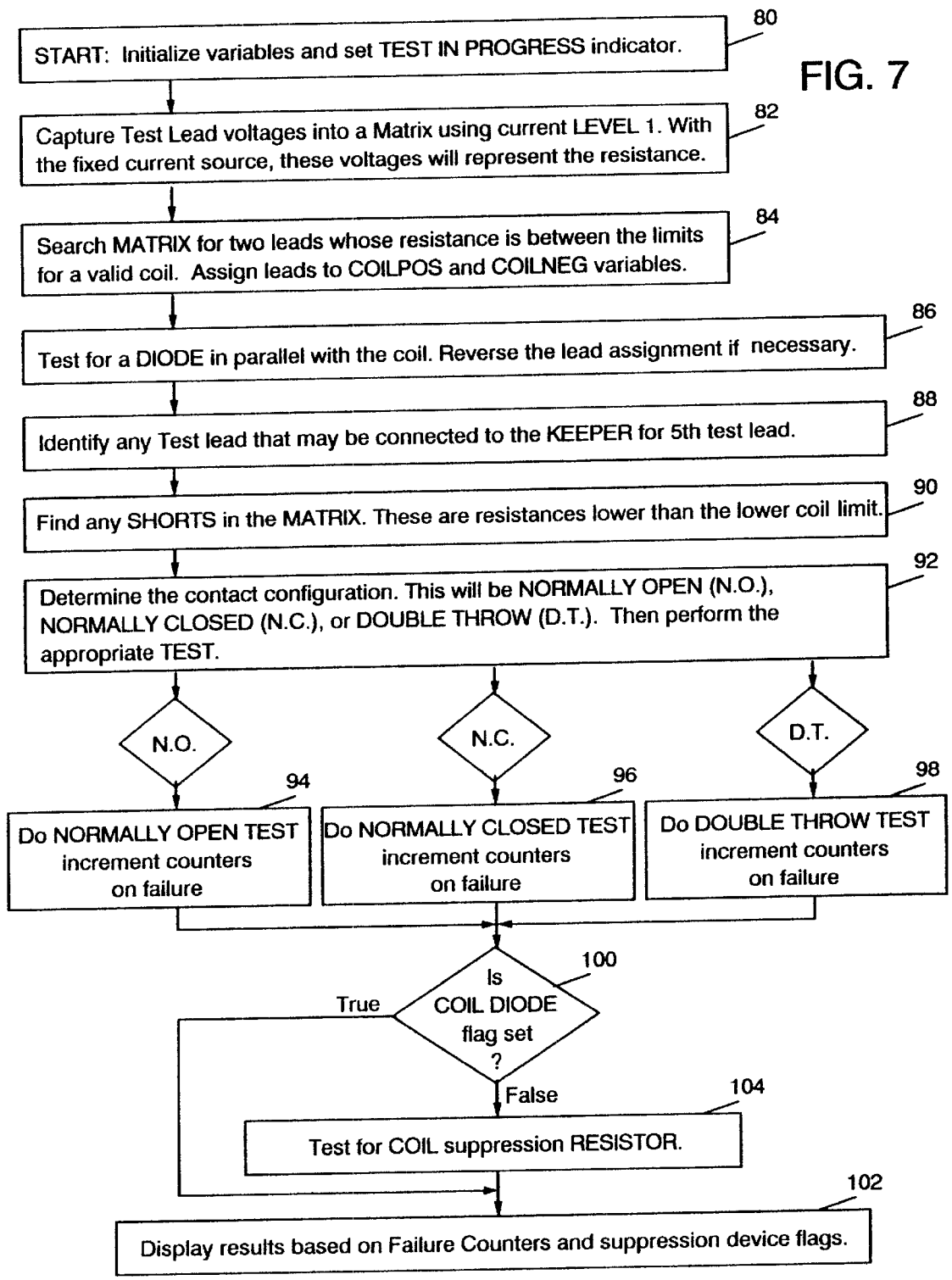
FIG. 7 is a high-level software flow diagram, showing the overall objectives and actions of the software, as implemented in the preferred embodiment of the present invention.

FIG. 7 shows an overview of the exemplary software used to operate the preferred embodiment of the present invention. Most of the program steps illustrated, in gross, in FIG. 7 are shown in greater detail in subsequent FIGs.

The start step 80 begins when the mechanic pushes the start button 54 to begin the testing operation. The start step initializes the variables within the microcontroller 66 and causes one of the LEDs 58 to be turned "on," thereby indicating to the mechanic that the test is in progress. While LEDs are the preferred indicators, they are only preferred and are not the only indicators that can be used in connection with the present invention.

The software program then proceeds to a step 82 at which the test leads 40 are sampled to ascertain what part of the relay is attached to each lead. Step 82 is performed by connecting one test lead to ground return and applying a small (LEVEL 1) current, preferably about 30 ma, to each test lead, in turn. In any event, enough current should be used for meaningful sensing of the relays expected and not enough to cause damage to any part of a relay). Each measurement of the voltage present at the current source test lead is then stored on a memory location of the microcontroller 66. Then, the next test lead is connected to ground return and the process is repeated. This process is explained more fully in connection with FIGS. 8 and 9.

The next step 84 analyzes the memory matrix of the results of program step 82 in search of the terminals of the coil of the relay under rest and assigns initial polarities (+/−) to each coil terminal. This process of this analysis is described in greater detail in connection with FIGS. 10 and 11.

In step 86, the memory matrix is analyzed to see if a diode is present in parallel with the coil terminals. If so, the initial polarities determined in the step 84 are tested and reversed if necessary. This analysis is more fully explained in connection with FIGS. 12 and 13.

The following step 88 analyzes the memory matrix to ascertain if one of the test leads is connected to the keeper lead 42. If no, the contacts are of the double throw (DT) configuration. If yes, the contacts are either of the normally-open (NO) configuration or the normally-closed (NC) configuration. This analysis is described in connection with FIGS. 14 and 15.

Step 90 analyzes the memory matrix of the microcontroller to find normally-closed contacts. This process is described in greater detail in connection with FIGS. 16 and 17.

Step 92 is intended to analyze the results of steps 88 and 90 to determine if the relay contacts are NO, NC, or DT. This determination is made with a software process shown in more detail in FIG. 18

In the program step 94, the functional operation of NO contacts is tested. In the preferred embodiment, the relay having NO contacts is tested sixteen times, in order to detect intermittent failures. The nature of the test is described in greater detail in connection with FIG. 19.

In the program step 96, the functional operation of NC contacts is tested. In the preferred embodiment, the relay having NC contacts is tested sixteen times, in order to detect intermittent failures. The nature of the test is described in greater detail in connection with FIG. 20.

In the program step 98, the functional operation of DT contacts is tested. In the preferred embodiment, the relay having DT contacts is tested sixteen times, in order to detect intermittent failures. The nature of the test is described in greater detail in connection with FIG. 21.

After the performance of the test of steps 94, 96, or 98, the program recalls, at a decision step 100, if a diode was found connected in parallel with the coil. If "yes," an operative diode was found to be connected in parallel with the relay coil, the program advances to a display step 102. At the display step 102, the results of the rest are displayed by illuminating one or more LEDs 58 on the front panel or face of the test set 46. This is usually a pass/fail grading system.

Figure 22:
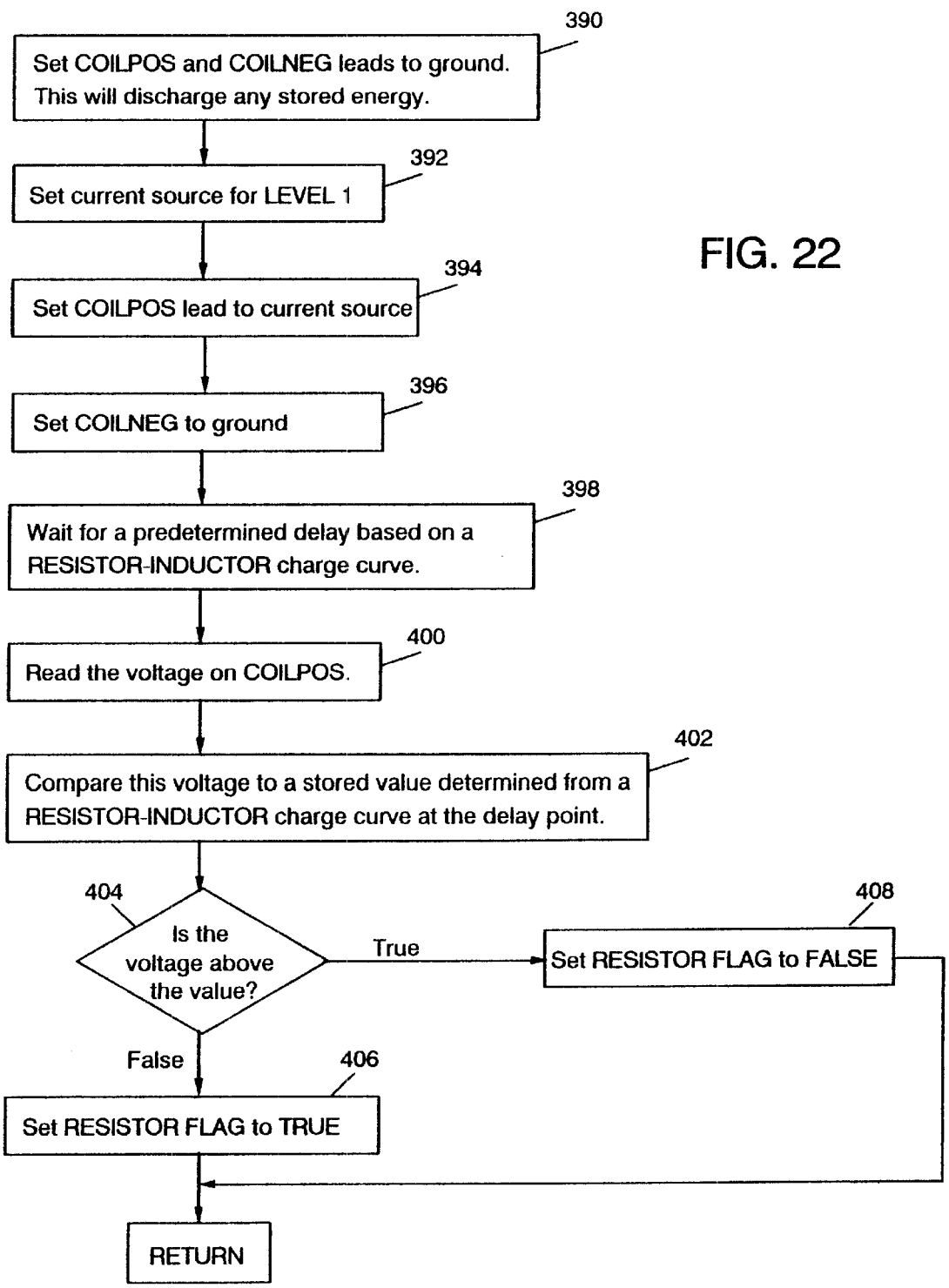
FIG. 22 is a flow diagram of the software to test for a coil-suppression resistor connected across the coil terminals of the relay under test, as illustrated in one of the blocks of FIG. 7.

However, if "no," an operative diode was not found to be connected in parallel with the relay coil, the program advances to a program step 104 that tests to see if a resistive coil-suppression device is connected in parallel with the coil of the relay under test. The test for a coil-suppression resistor is explained more fully in connection with FIG. 22.

If a relay passes all of the tests except those seeking a functioning coil suppression device, whether a diode or a resistor, it will preferably be passed conditionally. That is, it will be shown as good, but one of the LED readout indicators will inform the mechanic that the relay does not have suppression capability. Then, the mechanic will have to ascertain if that is important in the operating environment of that specific relay.

Specific Description of the Program an Circuit Operation

Figure 8:
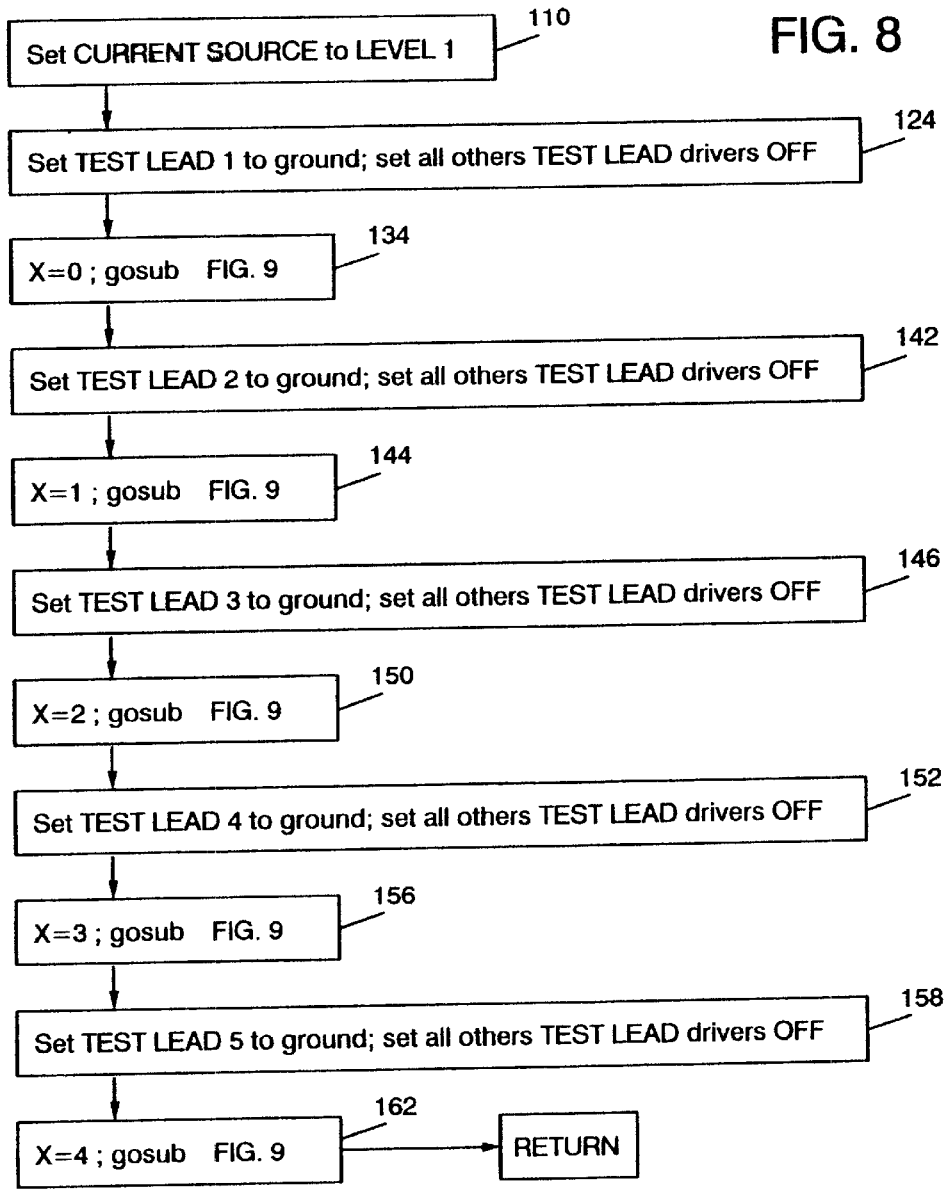
FIG. 8 is a flow diagram of the software to form a resistance matrix, as illustrated in one of the blocks of FIG. 7.

Referring now to FIG. 8, this portion of the program relates to the program step 82 of FIG. 7. The portion of the program shown in FIG. 8 is intended to perform the function of capturing the voltages across the several terminals of the relay and storing them in a memory matrix for later analysis, in order to determine which test lead is connected to which part of the relay. In the first program step 110, the microcontroller 66 (FIG. 4) sends a signal on one of its I/O terminals. That one of the I/O terminals 112 is connected to one of the twelve inputs of the inverter amplifiers 70 (FIG. 5). That inverter amplifier 114 delivers the logically inverted signal through an output resistor 116 to the base electrode of a switching transistor 118 (FIG. 3). That inverted signal turns ON the transistor 118, applying +V to one end of a resistor 120. The +V supply and the resistor 120, together, form a current source of a magnitude determined by the voltage of the +V supply and the resistance of the resistor 120. That current level (LEVEL 1) would preferably be about 30 ma. The other end of the resistor 120 is connected to a current supply bus 122 that feeds all five of the switching circuits 62.

The next step 124 causes the microcontroller 66 to send an ON signal from one of its I/O terminals 126 (FIG. 5) to the gate terminal of a field effect transistor (PET) 128 (FIG. 3). When the FET 128 turns ON, it connects the first test lead 130 to the common ground return 132. Meanwhile, the program step 124 also assures that the microcontroller 66 has placed signals on its other four I/O to assure that the corresponding FETS of the other four switching circuits 62 are OFF.

Figure 9:
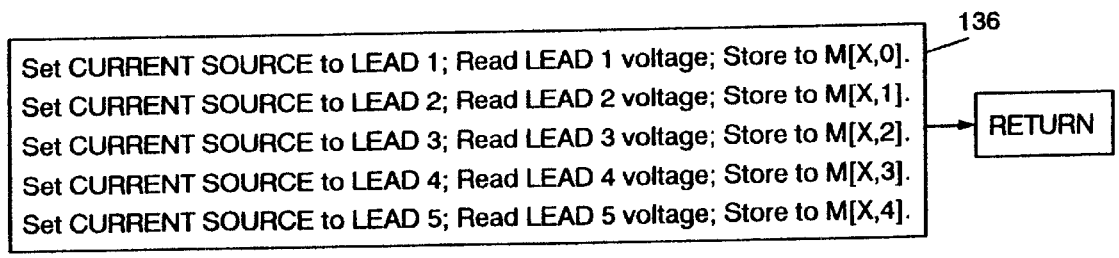
FIG. 9 is a flow diagram of a subroutine used in the flow diagram of FIG. 8.

The next program step 134 sends the program to the subroutine of FIG. 9. In the FIG. 9 subroutine, the main program step 136 causes the LEVEL 1 current source (transistor 118 and resistor 120) to be connected successively to each of the five test leads 40. To accomplish this, with respect to the first test lead 130, one of the I/O terminals 112 sends a signal to its associated one of the inverter amplifiers 70, which sends an inverted signal to a switching transistor 138 and turns ON the transistor 138. Because the FET 128 is also ON, the LEVEL 1 current is simply shunted to the ground 132, and the microcontroller 66 senses ground voltage on the first test lead and stores that fact in its memory matrix.

However, when the program step 134 turns OFF the switching transistor 138, and turns ON the corresponding switching transistor of the second test lead 140, the voltage sensed at the second test lead will be +V if the second test lead is not connected to anything that is connected to the first test lead 130. Conversely, if the second test lead is connected to a relay terminal that is interconnected to the test lead 130 in some way, the microcontroller 66 will sense a voltage on the test lead 140 that is something other than +V.

For example, if the test lead 140 is connected to one terminal of the relay coil, the other terminal of which is connected to the test lead 130—which is still connected to ground through the FET 128, the voltage sensed at the test lead 140 might be two or three volts. As another example, if the test leads 130 and 140 are connected to the terminals of the closed (NC) contacts of the relay under test, the microcontroller will sense ground voltage at the test lead 140.

The program step then proceeds to apply LEVEL 1 current to each of the other test leads in succession and causes the resulting voltage at each test lead to be sensed and stored in the memory matrix of the microcontroller 66. After thus applying LEVEL 1 current to each of the five test leads 40, in turn, the program returns to the FIG. 8 program and advances to a program step 142.

In the program step 142, the FET 128 of the first test lead 130 is turned OFF and the corresponding FET of the second test lead 140 is turned ON. The program then advances to the next step 144, which sends the program back to the subroutine of FIG. 9. The subroutine again sends LEVEL 1 current to each of the test leads 40, in turn, and senses the resulting voltage at each such test lead, as caused by the Level 1 current source. The subroutine again stores in the memory matrix of the microcontroller 66, the voltage resulting from each such sensing.

At the completion of so sampling each of the five test leads with respect to the test lead 140, the subroutine returns the program to the next step 46. The step 146 repeats the action of the steps 124 and 142, except this time, for the third test lead 148. The program then advances, at a gosub step 150, back to the FIG. 9 subroutine to again apply LEVEL 1 current successively to all five test leads, with the third test lead 148 grounded, and store the resulting voltage. The program then returns again to the FIG. 8 program and to the next program step 152.

At the program step 152, the fourth test lead 154 is grounded. The program then advances to the gosub step 156, which sends the program back to the step 136 (FIG. 9) which applies LEVEL 1 current to all five test leads 40 and stores the resulting sensed voltages into the memory matrix of the microcontroller 66.

The program then returns to FIG. 8, to the step 158 which grounds the fifth test lead 160. The gosub step 162 then sends the program back to the step 136 of FIG. 9, to sense and store the voltages from the final application of LEVEL 1 current to all five test leads 40. At this point, the program has finished examining each test lead with respect to every other test lead and has completed the program step 82 of FIG. 7. The program then advances to the program step 84 of FIG. 7, which is detailed in FIGS. 10 and 11.

Figure 10:
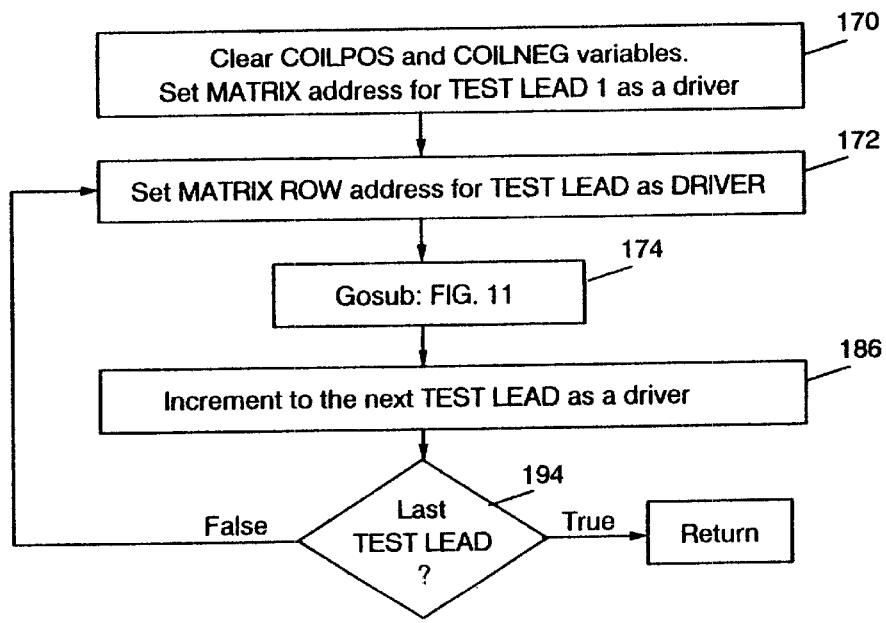
FIG. 10 is a flow diagram of the software to find the coil terminals of the relay under test, as illustrated in one of the blocks of FIG. 7.
Figure 11:
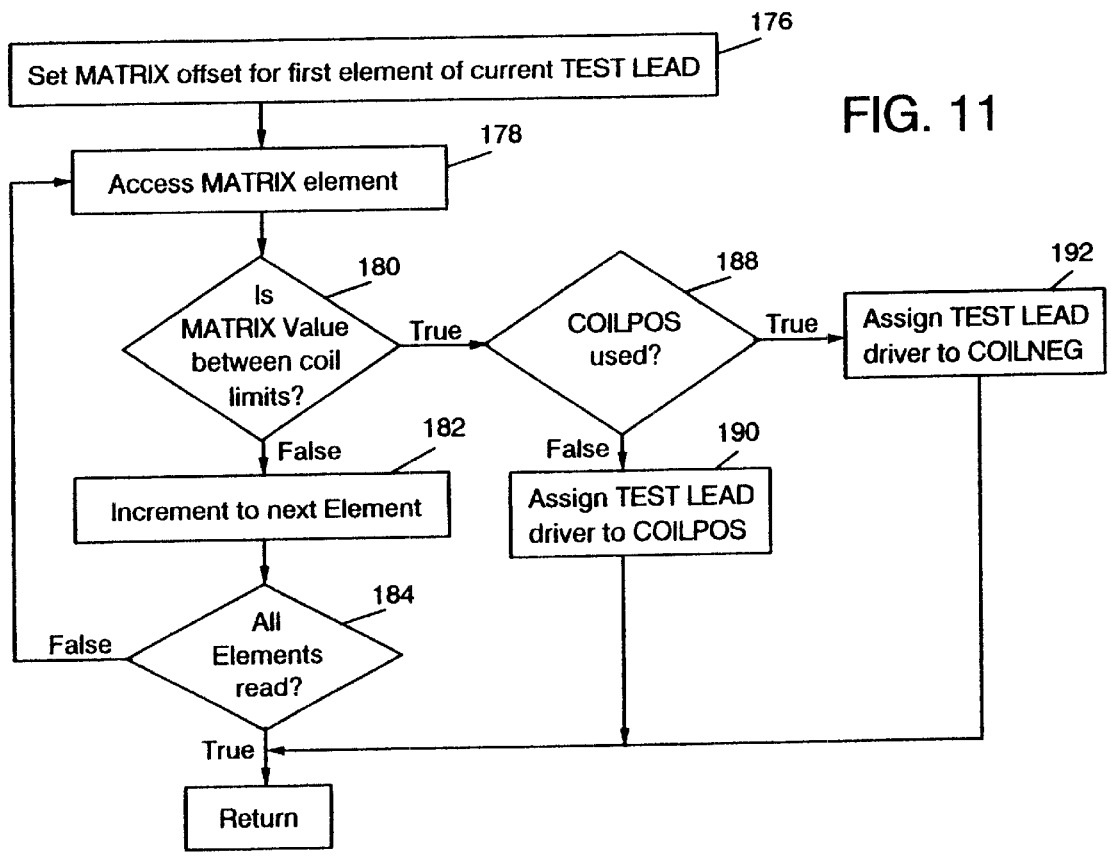
FIG. 11 is a flow diagram of a subroutine used in the flow diagram of FIG. 10.

Referring now to FIG. 10, with its subroutine of FIG. 11, this portion of the overall program analyzes the contents of the memory matrix in order to find which of the test leads 40 are connected to the coil of the tested relay. The first program step 170 clears all of the coil variables in the memory of the microcontroller 66. The program then advances to a step 172 which addresses the memory matrix to the first address of the first test lead, e.g., the test lead 130. At the gosub step 174, the program advances to the subroutine of FIG. 11.

The first step of the subroutine of FIG. 11 sets the memory matrix to the first offset (data stored from FIG. 8 program) from the sampling of the impedance between the five test leads, as connected to the terminals of the relay under test. The next step 178 accesses the data in that first offset memory location for the first test lead. The decision step 180 asks the question: does the voltage stored in the memory matrix (and thus the impedance between the tested terminals, represented by that memory location) correspond to an impedance value that is within the range of impedance values that are characteristic of a relay coil? If not (the usual case), the program advances to the next program step 182 which increments he memory address to the next impedance-representing data point and advances the program to a decision step 184. If all of the memory locations representing the impedances from this test lead have been considered, the subroutine returns to the incrementing step 186 of FIG. 10, to start the FIG. 10 program all over again for the next test lead.

However, if the decision step 180 finds that the impedance between the "driving" test lead set in step 172 (FIG. 10) and another test lead is within the range of impedances for the coil of a relay under test, the subroutine of FIG. 11 advances to another decision step 188. The decision step 188 asks if a test lead has already been tentatively designated as the positive terminal of the coil. If not, the program advances to the step 190, which tentatively designates the "driving" test lead as the positive terminal of the relay's coil.

However, if the decision step 188 concludes that the test lead connected to the positive terminal of the relay coil has already been tentatively designated, the program advances to a program step 192 which tentatively designates the "driving" lead as being connected to the negative terminal of the coil.

Returning now to the program step 186 of FIG. 10, each time that the subroutine of FIG. 11 finishes analyzing the memory matrix locations associated with a "driving" test lead with all the test leads, the step 186 increments the memory address to the next "driving" lead. When all five test leads 40 have been analyzed as "driving" leads, as determined in the decision step 194, the program advances from the step 84 (FIG. 7) to the step 86, which is detailed in FIG. 12 and its subroutine of FIG. 13. The program of FIGS. 12 and 13 is intended to detect a coil-suppression or coil-suppression diode connected in parallel with the coil terminals and to determine its polarity.

Figure 12:
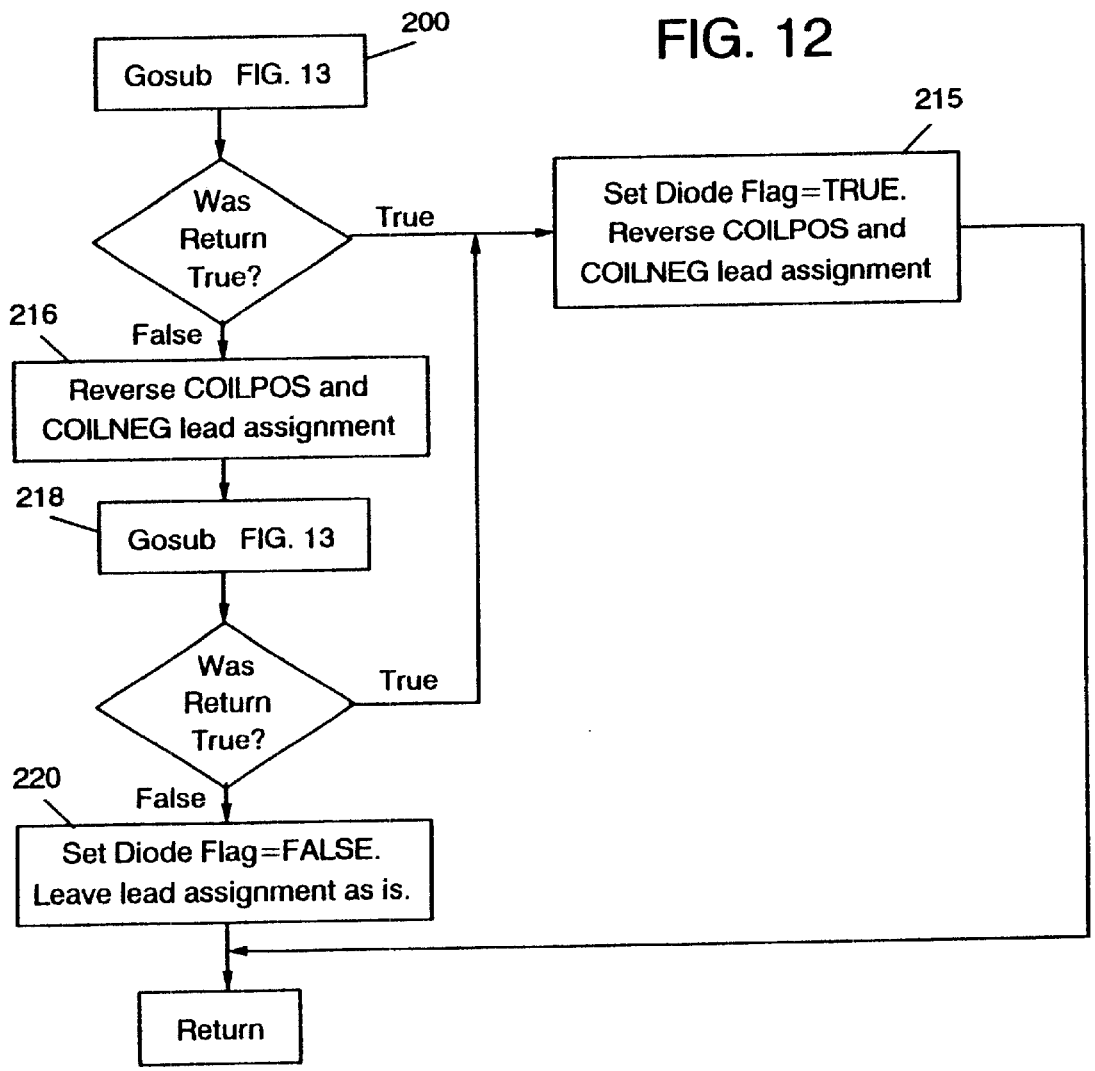
FIG. 12 is a flow diagram of the software to find a coil-suppression diode across the coil terminals of the relay under test, as illustrated in one of the blocks of FIG. 7.
Figure 13:
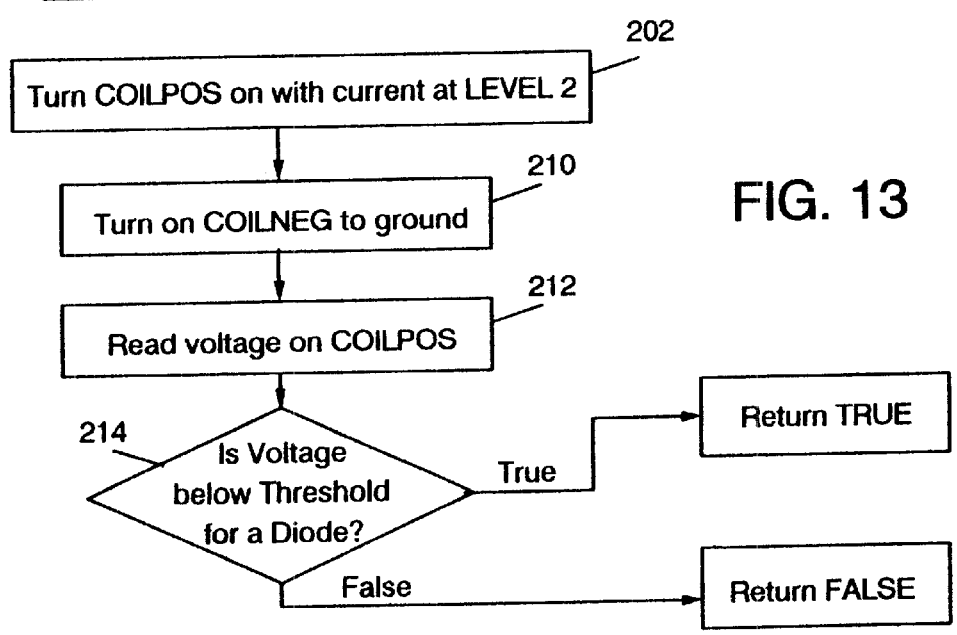
FIG. 13 is a flow diagram of a subroutine used in the flow diagram of FIG. 12.

The program of FIG. 12 actually starts with a gosub step 200 to send the program to the subroutine of FIG. 13. The first program step 202 of the subroutine of FIG. 13, applies current LEVEL 2 (preferably 120 ma) to the test lead which has been identified as COILPOS in the program of FIG. 10. Referring now to FIGS. 3, 4, and 5, the microcontroller 66 sends a signal on another one of the I/O terminals 112 to another one of the inverter amplifiers 70 which sends an inverted signal through a coupling resistor to the base of a switching transistor 206. The switching transistor 206 turns ON and applies +V to one end of a resistor 208, the value of which, considering the value of +V, allows as much as the 120 ma, preferred, to pass to the switching circuits 62. The same program step 202 also switches ON the transistor (corresponding to transistor 138) of the appropriate one of the switching circuits 62), as previously explained in connection with LEVEL 1 current for the program of FIG. 8. When the transistor corresponding to the transistor 138 turns ON, it applies the 120 ma to the particular test lead (of the test leads 40) that has been assigned the initial designation of COILPOS.

The subroutine of FIG. 13 then advances to the step 210, at which the microcontroller 66 energizes the appropriate one of its I/O terminals 126. The signal thus imposed on that appropriate I/O terminal causes the appropriate one of the FET switches that corresponds to the FET 128, in the appropriate one of the switching circuits 62 of FIG. 3 to turn ON. When the appropriate FET turns ON, it connects to common ground return that test lead that has been initially designated as COILNEG in the program of FIG. 10. The current source comprised of +V and the resistor 208 tries to send the 120 ma sampling current through the coil and any forward-biased diode that might be connected in parallel with the coil.

The next program step 212 causes the voltage at the COILPOS-designated test lead to be sensed. At the decision step 214, If the voltage is low enough to suggest that any diode across the coil terminals is forward biased, the program returns to a program step 215 in FIG. 12. In the program step 215, the memory matrix stores that the diode was forward biased and thus is confirmed as being present and then reverses the initial or tentative polarity designations of the test leads that are connected to the diode. This polarity reversal assures that when the test progresses to sending a high current through the coil to operate the relay, the diode will not be forward biased and destroyed by the high current.

If the decision step 214 concludes that the voltage across the coil was too high to suggest a forward biased diode, the program advances to a step 216. At the step 216, the program causes the COILPOS and COILNEG designations to be reversed for further testing to assure that the diode has not become an open circuit but is in fact present and operative. The program then advances to another gosub step 218, which again sends the program to the subroutine of FIG. 13, to the same current-flow and voltage-sensing process described above. This second trip through the subroutine of FIG. 13 is to see if the diode in parallel with the coil has now been forward biased after reversing the tentative polarity designations, COILPOS and COILNEG.

If yes, the diode has been forward biased, the program goes to the step 215 to store a designation in the memory matrix that a functioning diode has been found and then to reverse the polarity designations in order to avoid burning out the diode when energizing the coil. If no, the diode was found in the decision step 214 not to be forward biased, it means that the alleged diode was not forward biased by the current flowing in either direction and thus may be electrically ⬚open.⬚ Therefore, if the diode was not forward biased after the polarity reversal of program step 216, the decision step 214 sends the program to a step 220 which stores a memory matrix notation that no functioning diode is connected in parallel with the coil terminals. Also, at step 220 no further change is made to the tentative polarity designation of the coil. This concludes that portion of the program represented by the step 86 of FIG. 7. The program now advances to program step 88 for test to see if a test lead is connected to the keeper 42, which program is detailed in FIGS. 14 and 15.

Figure 14:
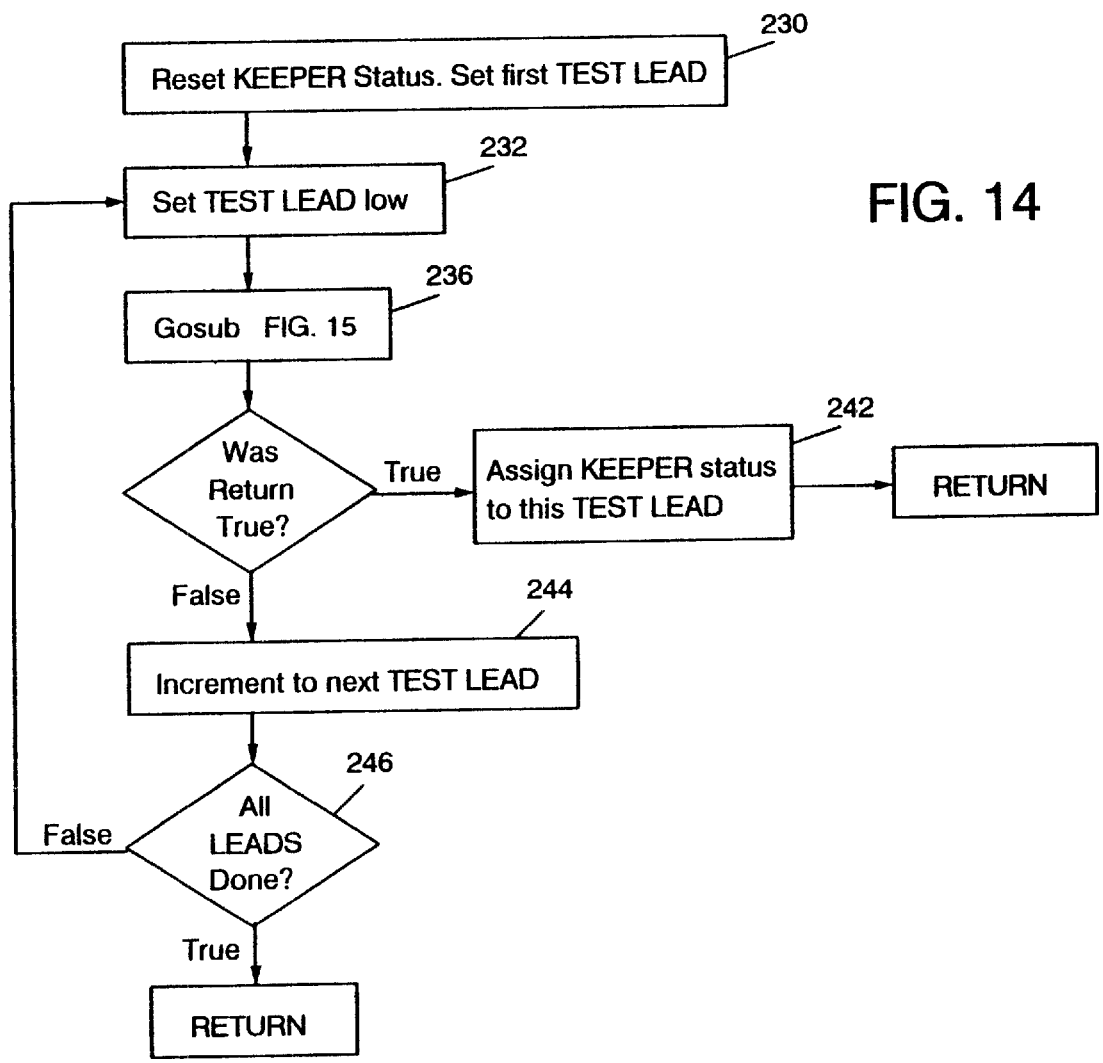
FIG. 14 is a flow diagram of the software to find if one of the test leads is connected to a keeper conductor of the test set of the preferred embodiment of the present invention, as illustrated in one of the blocks of FIG. 7.

The program of FIG. 14 starts with a step 230 in which the keeper status within the memory matrix is reset and the first test lead is set to be tested. In the next step 232, the test lead is set to a low voltage. This is done by turning ON the appropriate FET 128 of the switching circuits 62. Referring to FIG. 3, the open-circuit voltage of the keeper 42 is set by a resistor network 234, to somewhere between the voltages of +V and the common ground return. Therefore, when a test lead is connected to the keeper 42 and is connected to the common ground return 132, it drives the keeper to near ground potential.

Figure 15:
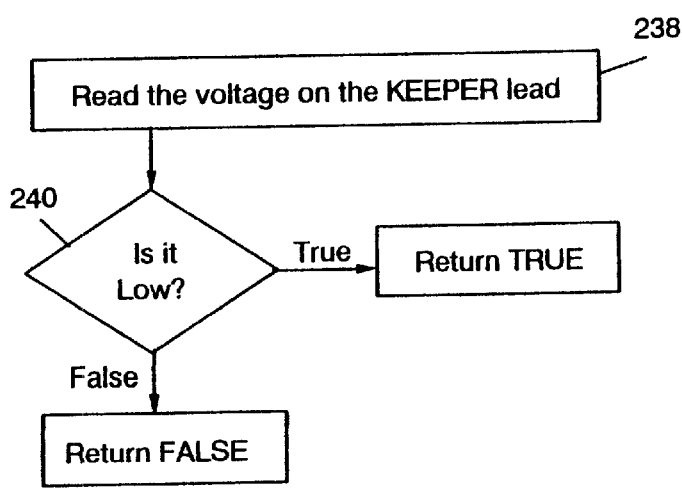
FIG. 15 is a flow diagram of a subroutine used in the flow diagram of FIG. 10.

From the step 232, the program branches at a gosub step 236 to the subroutine of FIG. 15. The first step 238 of the subroutine causes the voltage of the keeper to be sensed. If the keeper voltage is determined in the decision step 240 as being low, the program branches back to FIG. 14, to the step 242. The step 242 causes the test lead to be flagged in the memory matrix as being connected to the keeper. From this point, the program proceeds to FIG. 16.

However, if the decision step 240 does not find that the keeper voltage is low, the program branches back to a step 244 in FIG. 14, which increments this test to the next test lead. A decision step 246 then decides if that prior test lead designation was for the last of the five test leads. If not, the program proceeds in the same loop through steps 232, 236 and the subroutine of FIG. 15 until the decision step 246 concludes that the last test lead has been tested in this program and branches the program to FIG. 16. The program has now identified if a test lead is connected to the keeper 42, and if so, which one, see program step 88 of FIG. 7. The program of FIG. 7 now advances to the program step 90 to look for any shorts (normally-closed contacts—NC). This is shown in detail in the program of FIG. 17.

Figure 17:
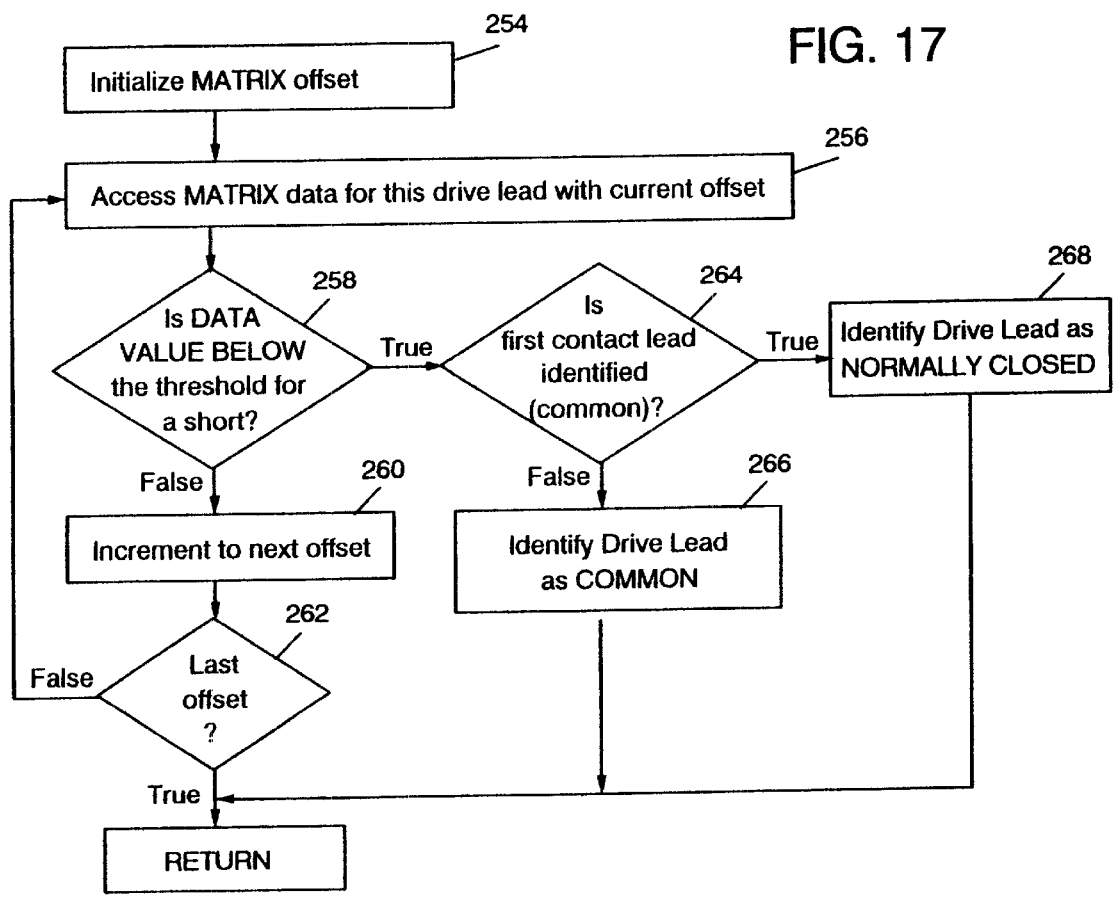
FIG. 17 is a flow diagram of a subroutine used in the flow diagram of FIG. 16.

In the first program step 250 of FIG. 17, the first test lead is set as the drive lead. The next step is gosub 252 which branches the program to the subroutine of FIG. 17. The first step 254 of the subroutine initializes the memory matrix address offset to begin analyzing the data stored in the memory matrix. The subroutine then advances to the program step 256 which compares the data stored for the voltage of the first offset (first lead) with respect to the first lead. The is a dummy test having no validity but allowing the program to keep a rational routine. Subsequent offsets are to the other test leads with respect to the first test lead.

If, in a decision step 258, the memory matrix data for the test of the selected offset (test lead) with respect to the selected drive (test lead) shows a voltage below a threshold for a short (closed contacts) it is assumed that this offset is a closed circuit. A closed circuit determination indicates that the offset is the dummy offset for this drive lead or that the drive test lead and this offset test lead are connected to the terminals of the normally closed contacts of the relay. If the voltage is not below the threshold, the program advances to a step 260 at which the offset memory matrix address is incremented. The program then advances to a decision step 262, which sends the program back to the step 256 if that was not the last offset or returns the program to FIG. 16 if it was the last offset.

If, in the decision step 258, it was determined that the data value was below the threshold for a short, the program branches to a decision step 264 which asks if the first contact of the relay has been identified—arbitrarily call "common." If not, the program advances to a step 266 which causes a memory flag to identify the current drive test lead as the "COMMON". From the program step 266, the program returns to FIG. 16.

If the step 264 determines that a test lead has already been identified as "COMMON", the program advances to a program step 268. The step 268 causes a flag to be stored in the memory matrix to identify the current drive test lead as being connected to the terminal of a relay contact of a normally-closed pair of contacts. From the step 268, the program returns to FIG. 16.

Figure 16:
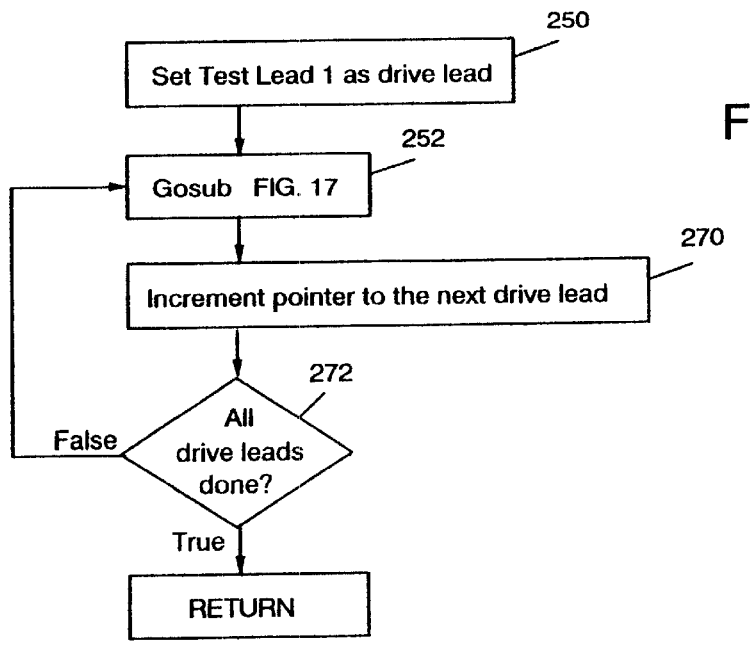
FIG. 16 is a flow diagram of the software to find the terminals of possible normally-closed contacts of the relay under test, as illustrated in one of the blocks of FIG. 7.

After proceeding through the subroutine of FIG. 17 with a given test lead as the drive lead, the program passes from FIG. 17 back to FIG. 16 at a program step 270. The program step 270 increments the drive lead designation to the next lead. At the decision step 272, the program branches back to the subroutine of FIG. 17 with the next drive lead designated. However, if the prior drive lead was the last of the test leads 40 to be designated as a drive lead in this portion of the program, the program advances to FIG. 18. With the identification of closed contacts (or other shorts) in the relay, the program step 90 of FIG. 7 has been completed, and FIG. 18 shows the detailing of the steps included in the step 92 of FIG. 7.

Figure 18:
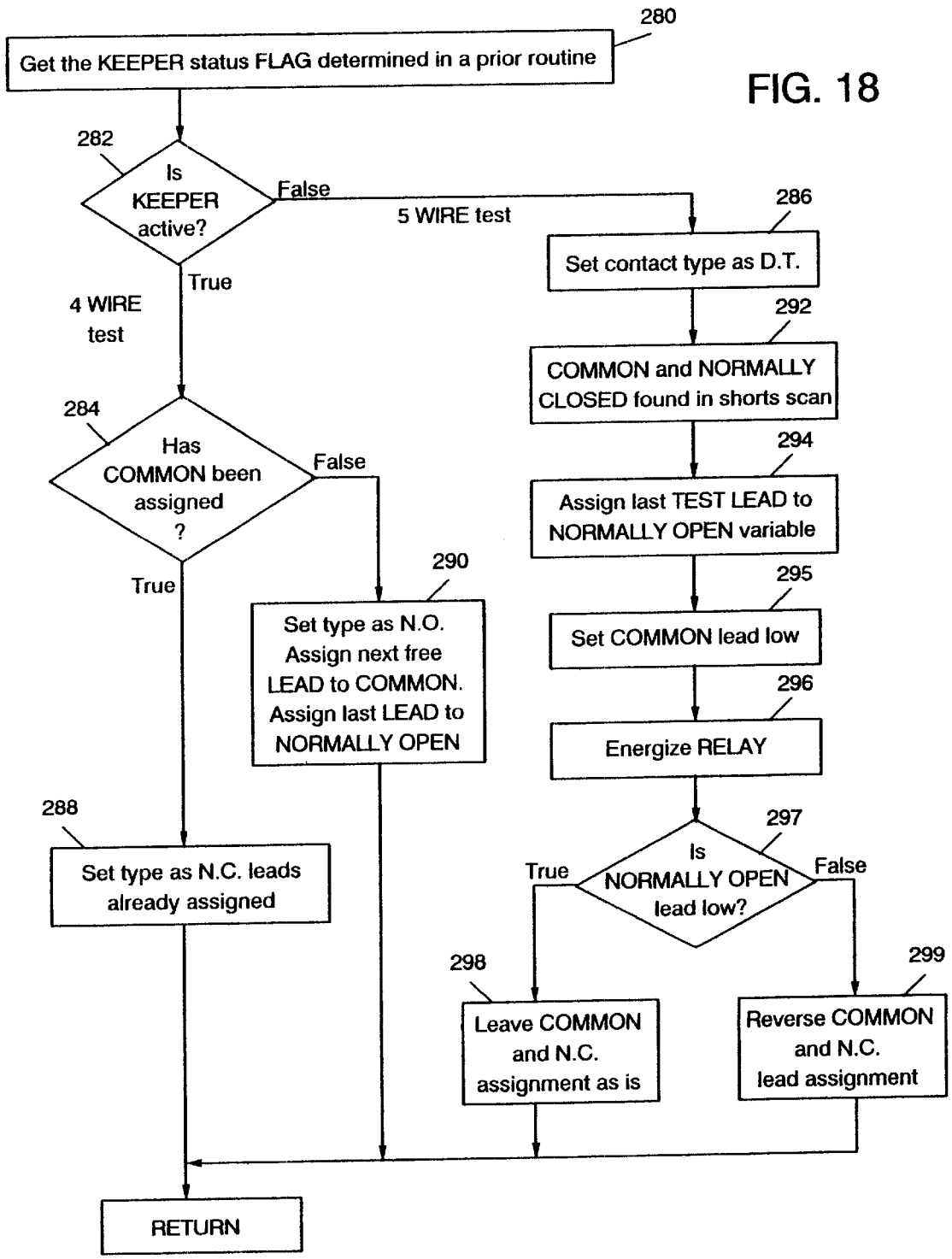
FIG. 18 is a flow diagram of the software to determine contact configuration of the relay under test, as illustrated in one of the blocks of FIG. 7.

The program of FIG. 18 is intended to sort out the contact configuration of the relay under test. The first step 280 obtains from the memory matrix the flag that identified if one of the test leads was connected to the keeper 42 and, if so, which one. In a decision step 282, the program branches according to whether or not a test lead is connected to the keeper. If yes, it is a test of a four-terminal relay (NC or NO), and the program branches to a decision step 284. If no, it is a test of a five-terminal relay, probably with double throw (DT) contacts, and the program branches to a step 286, which stores that fact into the memory matrix.

If the test relay contacts are NC, the decision step branches the program to a program step 288 which stores a flag to the effect that the relay has NC contacts. If a common has not been assigned, the relay contacts are probably normally open (NO), the program step 290 causes the relay contacts to be so flagged in the memory matrix, with "common" and "normally-open" designations arbitrarily assigned.

If, at the decision step 282, the program branched to the step 286, the program advances from the step 286 to the step 292. The step 292 confirms that the common and normally closed contact designations were made as a result of the scan for shorts between the test leads 40, previously made. The program then advances to the program step 294 which causes the last test lead to be identified, flagged as being connected to the NO contact of the DT contacts.

However, at this point, the microcontroller 66 has flagged the fact that it has a pair of normally open (NO) contacts and a pair of normally closed (NC) contacts. However, the microcontroller has only assumed which one of the two NC contacts is actually the common contact that makes contact with the other NC contact and with the NO contact when the coil is energized. Therefore, it is necessary for the microcontroller to determine which of the two NC contacts is actually common to the two contact pairs. For this purpose, the program now advances from the program step 294 to a program step 295 at which the voltage of the assumed common lead is connected to the common ground Potential or voltage.

The program then advances two a step 296 at which the relay is energized by passing an energizing current through the relay coil. This process is more fully described in connection with FIG. 19 and the repetitive testing of the relay contacts. After energizing the relay, the program advances to a decision step 297, at which the NO contact is tested to see if it is now at common ground voltage. If the NO contact is now low (common ground voltage), the assumed designation of the common relay NC contact is deemed to be correct, and the program advances to a step 298. At the program step 298, the assumed designation of the common NC is confirmed and the program continues to FIG. 19, as described below in connection with FIG. 7.

However, if the decision step 297 finds that the NO contact of the energized relay contact is not now low, the program branches to a step 299. At the program step 299, the designation of the assumed common NC contact is reversed, so as to designate the other NC contact as common. The program is now ready to begin repetitive testing of the relay contacts.

Referring now to the step 92 of FIG. 7. The type of relay contacts has now been determined, and the program now branches to test only the type found in the relay under test.

Figure 19:
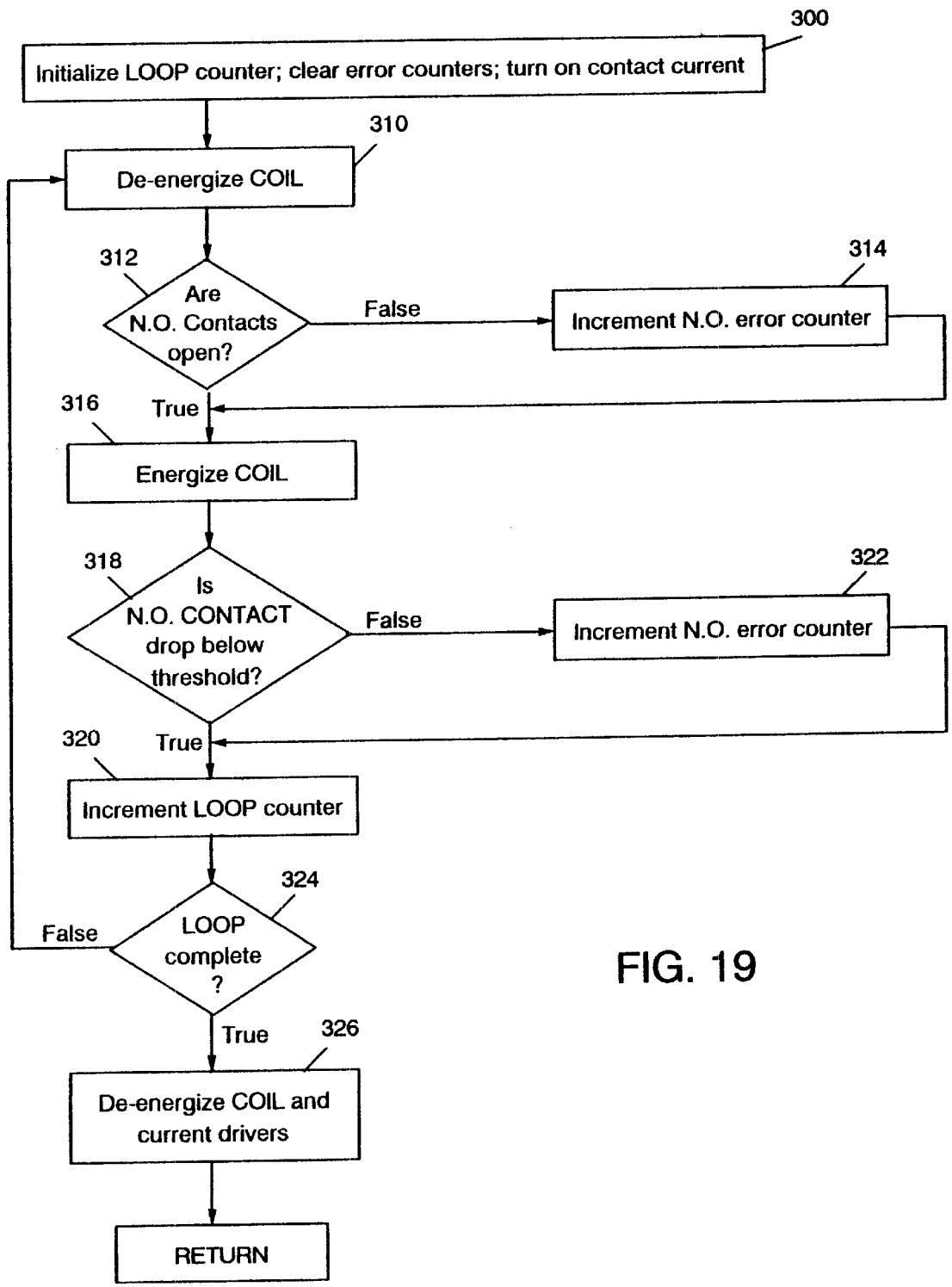
FIG. 19 is a flow diagram of the software to test normally-open contacts of the relay under test, as illustrated in one of the blocks of FIG. 7.

If the relay has NO contacts, the program branches from step 92 of FIG. 7 to the step 94, which is detailed in FIG. 19. The first step 300 initializes a loop counter for repetitive testing of the NO contacts of the relay. The step 300 also clears the error counter so that the relay under test will not be failed improperly. The step 300 also causes a contact-testing level of current to be turned ON.

Referring to FIG. 3, a current limiting resistor 302 is preferably connected between +V and a bus conductor 304. It has been found advantageous and preferable to test the closed relay contacts for full and adequate continuity by passing a current of about 0.5 amperes through them. However, this is just an arbitrary value. The voltage +V and the resistance of the resistor 302 are chosen accordingly. The contact testing current from the resistor 302 is turned ON for the relay contacts by a signal from one of the I/O terminals 112 of the microcontroller 66 (FIG. 4) to the input of one of the inverter amplifiers of the group of inverter amplifiers 70 (FIG. 5). That inverter amplifier then sends an inverted signal from its output to the base terminal of a switching transistor 306 of one of the switching circuits 62 (FIG. 3).

The inverted amplifier signal then turns ON the transistor 306 of the selected one of the switching circuits 62, in order to connect the current source of the resistor 302 and +V to the COMMON contact terminal of the relay under test. That selected one of the switching circuits 62 is the switching circuit that is connected to the test lead that has been identified "COMMON" in the program of FIG. 18. At the same time, the microcontroller 66 sends a signal on one of its I/O terminals 126 to the FET 128 within the switching circuit of the switching circuits 62 that is connected to the test lead that has been identified as normally-open in FIG. 18. That FFT 128 then applies ground return to the terminal of the normally-open contact of the test relay. But for the fact that the NO contacts should be open, the connections made in the step 300 would complete a 0.5 amp current path through the relay contacts.

The next step 310 assures that the coil of the test relay is not energized. Therefore, when the program advances to the decision step 312, there should be a high voltage at the COMMON test lead. If not, if the voltage at the test lead identified as COMMON is low, that means that the NO contacts are closed when they should be open. That is an error and the program branches to an error count increment step 314 which increments the error counter of the memory matrix by one. The program then advances to a step 316. If the decision step 312 had found that the contacts were actually open, as they were supposed to be, it would have branched the program directly to step 316.

At the program step 316, the relay oil is energized. Referring now to FIGS. 3, 4, and 5, the microcontroller 66 sends a signal from one of its I/O terminals 112 to the base terminal of the emitter follower transistor 72 (FIR. 5), which turns ON the transistor 72. The transistor 72 turns ON the transistor 74 (FIG. 3) which applies +V, without limiting resistance, to the bus 122. The microcontroller 66 also sends a signal on one of its I/O terminals 112 to the input of one of the inverter amplifiers 70, the output of which issues an inverted signal. That inverted signal is sent to the base of the transistor 138 in the switching circuit (of switching circuits 62) that is connected to the test lead that has been identified as COILNEG in FIG. 12. This applies +V directly to the coil terminal that is connected to the cathode of the coil-suppression diode, if there is one. At the same time, the microcontroller 66 sends a signal from one of its I/O terminals to the gate of the FET 128 of the switching circuit 62 that is connected to the test lead that has been identified as COILPOS in FIG. 12. Full +V voltage has been arbitrarily chosen to be approximately appropriate for energizing the coils in order to operate the relays expected to be tested by this preferred embodiment of the present invention. Therefore, the test relay is now operated in the program step 316.

The program now advances to a decision step 318, at which the voltage across the relay contacts is sensed and measured. Since the relay should now be operated, and the NO contacts should now be closed, the resistance across the now-closed contacts should be very low and, thus, the voltage across the closed contacts, which are conducting a substantial electrical current, should also be very low. If the voltage across the contact is low enough, the decision step 318 advances to a step 320. However, if the voltage across the contacts is not sufficiently low, the program branches from the decision step 318 to a program step 322. The step 322 increments an error counter in the memory matrix to indicate that the test of the relay has found a fault or error in the relay. After noting and counting the error, the program advances from the program step 322 to the step 320.

The step 320 increments the loop counter in the memory matrix, and the program advances to a decision step 324. The decision step 324 examines the contents of the loop counter, looking for a full count. If a full count has not been reached, the program loops back to the step 310 to repeat the test. A fault in a relay, as with most equipments, might be continuous or intermittent. A continuous fault, once found, quickly results in discard or repair of the faulty device. However, intermittent faults are more difficult. Therefore, it is preferred, in this embodiment of the present invention, to perform a multiplicity of identical test on the relay contacts, in order to find an intermittent fault. The number of successive retest that are required are dependent upon the nature of the environment of the relay and the nature of the relay contacts, themselves. Also, arbitrary decision making and expeditious test play a part in deciding how many times to test the relay contacts. For the purposes of the present, preferred embodiment of the present invention, sixteen successive tests has been deemed sufficient.

When the decision step 324 senses that the loop counter has counted the desired number of tests, the program is advanced to a step 326. In step 326, the coil is de-energized and the driving transistors are also de-energized. This concludes testing of the NO contacts of a relay.

Figure 20:
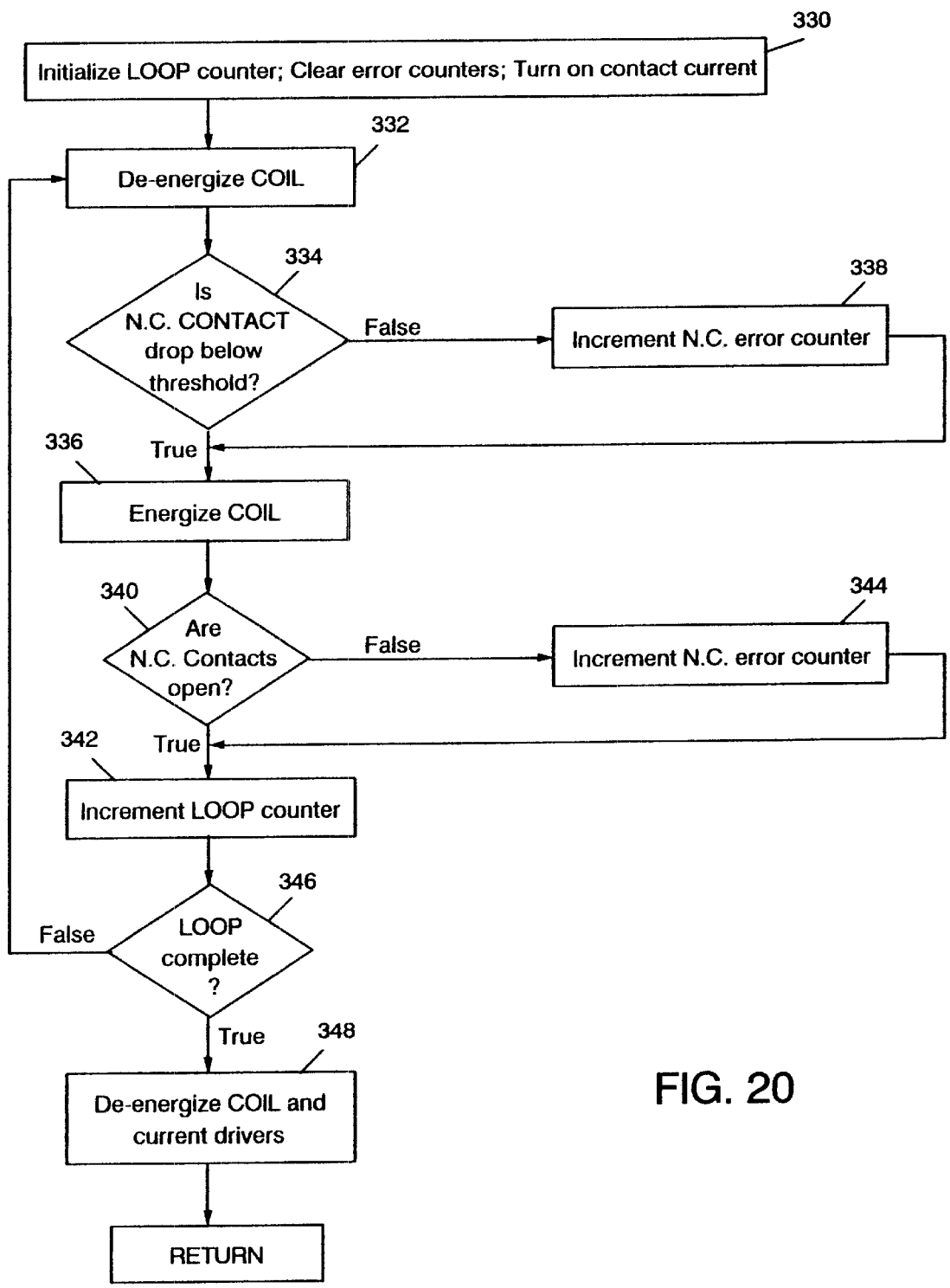
FIG. 20 is a flow diagram of the software to test normally-closed contacts of the relay under test, as illustrated in one of the blocks of FIG. 7.

If the relay is found to have normally-closed (NC) contacts, the program step 96 of FIG. 7 is used. The program step 96 is detailed in FIG. 20. It will be noted that the program of FIG. 20 is the same as the program of FIG. 19, with the exception of the questions asked in the decision steps 312 and 318 of FIG. 19. That slight difference reflects the fact that the program of FIG. 19 tests NO contacts and the program of FIG. 20 tests NC contacts.

In the first step 330 of FIG. 20, the loop and error counters are cleared and the contact current is turned on, as was done in the case of FIG. 19. The program then advances to a step 332, at which point the coil is de-energized. At a decision point 234, the voltage across the NC contacts is measured. If the voltage is low enough, the program advances to a step 336. However, if the voltage across the contacts is too high, the program branches to a step 338, at which the error counter is incremented. After incrementing the error counter, the program advances to the step 336.

At the step 336, the coil is energized, in order to open the normally-closed relay contacts. The program then advances to a decision step 340, which determines if the NC contacts are now open. If the step 340 finds the contacts to be open, the program advances to a step 342. However, if the step 340 finds the contacts to still be closed, the program branches to a program step 344, at which the error counter is incremented. After incrementing the error counter, the program advances to the step 342. The step 342 advances the loop counter for a repeat of the test.

From the step 342, the program advances to a decision step 346 which determines if the loop counter has reached a count equal to the number of repetitive tests desired. If not, the program loops back to the program step 332, to repeat the test. If the loop counter does indicate that the desired number of tests has been run, the program advances to the step 348. At the step 348, the coil is de-energized and the current driving transistors (FIGS. 3 and 5) are all turned OFF. This concludes the program block 96 of FIG. 7. If the relay has been identified as having double-throw (DT) contacts, the program will advance from step 92 to step 98. The program of step 98 is detailed in FIG. 21. The program of FIG. 21 looks much like the programs of FIGS. 19 and 20, except that decision steps such as the decision steps 312 and 318 of FIG. 19 and decision steps 334 and 340 of FIG. 20 are all included in FIG. 21. Appropriately, DT contacts include both NO and NC contacts.

Figure 21:
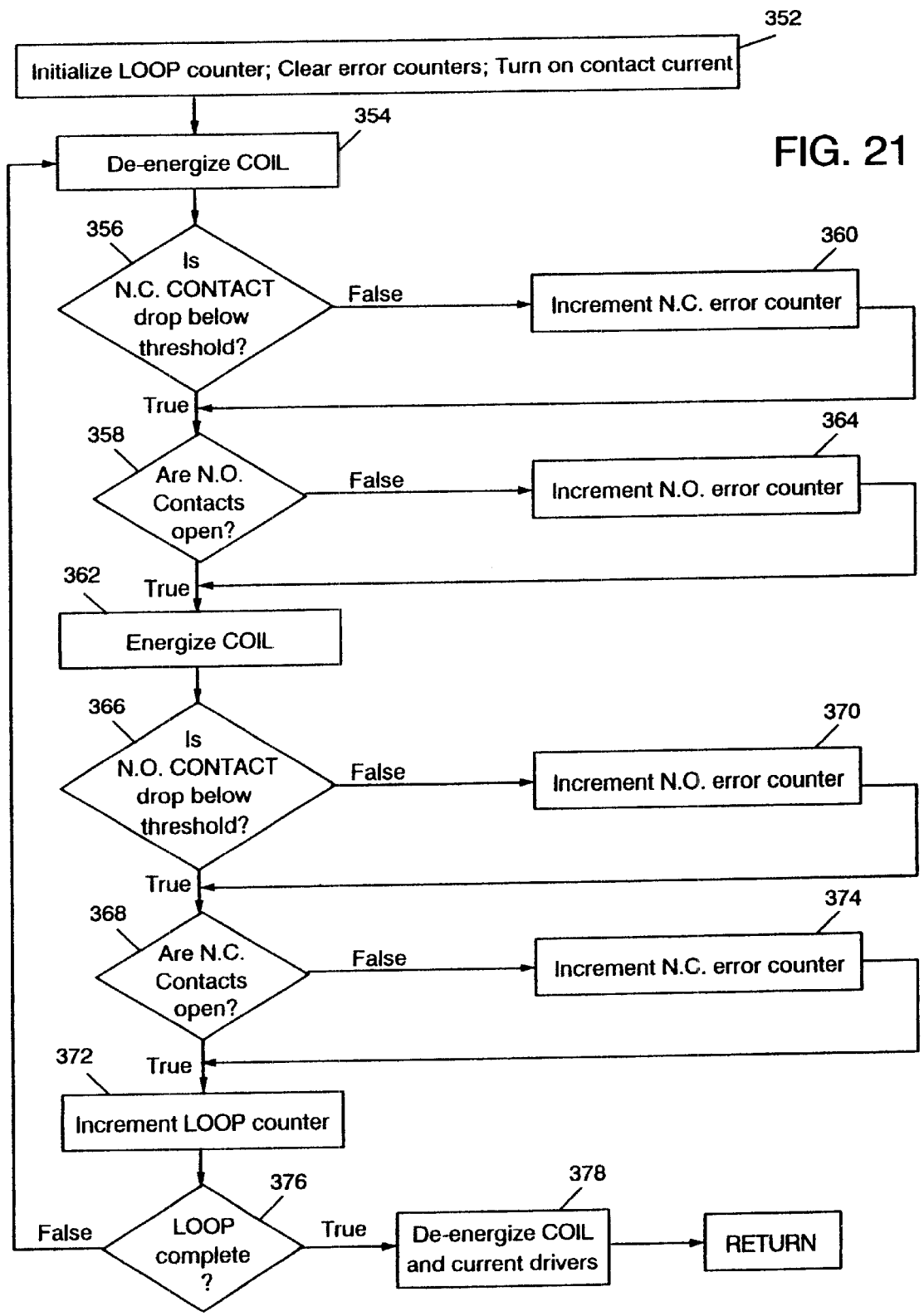
FIG. 21 is a flow diagram of the software to test double-throw contacts of the relay under test, as illustrated in one of the blocks of FIG. 7.

In the first step 352 of the program shown in FIG. 21, the loop and error counters are both set to zero or cleared and the contact test current (preferably about 0.5 amp.) is established. The next step 354 assures that the coil is de-energized. A decision step 356, determines if there is a low-enough voltage across the NC contacts. If so, the program advances to a decision step 358. However, if not, the program branches from the decision step 356 to a step 360, at which the error counter is incremented. After incrementing the NC error counter, the program advances from the step 360 to the decision step 358.

The decision step 358 determines if the NO contacts are actually open when they are supposed to be. If so, the program advances to a step 362. If not, the program branches to a step 364 which increments the NO error count. From the step 364, the program advances to the step 362.

At the step 362, the coil is energized to open the NC contacts and close the NO contacts. The program then advances to a decision step 366 which ascertains if the voltage drop across the now-closed NO contacts is low enough. If so, the program advances to a decision step 368. If not, the program branches to a step 370, which increments the NO error counter and advances the program to the decision step 368. At the decision step 368, the relay tester decides if the NC contacts are now open. If so, the program advances to a step 372. If not, the program branches to a step 374, which increments the NC error counter; and the program advances to the step 372.

The program step 372 advances the loop counter, and the program advances to a decision step 376, which determines if the loop count indicates that the relay contacts have been tested enough times. If the DT contacts have not been tested as many times as desired, the program loops back to the step 354, to begin the test another time. However, if the loop counter indicates that the relay contacts have been tested enough times, the program advances to a step 378, which causes the coil to be de-energized and the switching transistors that applied electrical current to the contacts, to be turned OFF. This ends the test of the contacts of the DT contacts of a relay.

Referring to FIG. 7, after the relay contacts have been tested, using the contact tests of steps 94, 96, or 98, the program advances to the decision step 100. The decision step 100 need not wait until after contact testing but can be used at any point in the program after program step 86⅜ as detailed in FIG. 12.

If a diode has been identified in parallel with the coil terminals of the relay, the program advances from the decision step 100 to the display step 102. However, if no diode has been found connected across the relay coil, the program advances to the resistor test step 104, which is detailed in FIG. 22. The program of FIG. 22 searches for an coil-suppression resistor of sufficiently high conductance, connected across the terminals of the coil of the relay. In the first step 390 of the program of FIG. 22, the FETs 128 of the switching circuits 62, that are associated with the test leads that have been identified as being connected to the relay coil are turned ON. This is to assure that there is no substantial residual electromagnetic flux surrounding the relay coil.

The program then advances to a step 392 which sets the test current source to LEVEL 1. This is the 30 ma current level that is used to identify the relay terminals, in the program of FIG. 8 (using transistor 118 in FIG. 3). The program then advances to a step 394, at which the test lead that has been identified as COILPOS (in FIG. 10) is connected to the current source (the appropriate transistor 138 in FIG. 3). The program then advances to a step 396, which (turns on the appropriate FET 128) sets to ground return the test lead that has been identified in FIG. 10 as COILPOS.

Once these two test leads have been connected as specified above, the microcontroller 66 waits, at the program step 398, for a very short interval, preferably about ten microseconds, for the relays contemplated for the present preferred embodiment. Then, at the program step 400, after the brief delay, the voltage at COILPOS is read and stored in the memory matrix. In the program step 402, that voltage reading is compared with a predetermined standard that has been previously determined. Such a standard can be worked out in any number of ways, for example, experimentally or analytically, for the contemplated types of relays to be tested, considering the typical coil inductance expected, the conductivity of the coil-suppression resistors that might be used, and the delay interval desired.

A decision step 404 asks if the voltage sampled from the test relay's coil terminals is above the standard. If not, it means that an coil-suppression resistor is present and has instantly shunted some of the current past the coil. Therefore, the program advances to a step 406 which stores a flag in the memory matrix to indicate that a suppression resistor is present.

However, if the voltage is found to be above the standard, the inductance of the coil has caused a very slow rise in the current level, indicating that no coil-suppression resistor is present. In that case, the decision step 404 causes the program to branch to a step 408 which sets a flag in the memory matrix to note the absence of a suppression resistor. The program then returns to step 102 of FIG. 7, which causes the relay test set to display, on its face or cover, the results of the test, including the presence or absence of a coil-suppression device, e.g., a diode or a resistor.

While the form of the apparatus and method steps herein described constitute a preferred embodiment of the present invention, it is to be understood that the invention is not limited to this precise form of either the apparatus or method disclosed herein and that changes may be made therein without departing from the scope of the invention which is defined in the appended claims.

What is claimed is:

1. A method for automated testing of relays having a plurality of electrical terminals variously connected to at least one actuation coil and to at least one pair of electrical-circuit-completing contacts, said automated testing method comprising the steps of:

a. determining the electrical resistance between each terminal of the relay and every other terminal of the relay;

b. identifying the terminals that are connected to the actuation coil of the relay, based upon a determination that the electrical impedance between said two terminals is within an arbitrarily-determined range of electrical impedance values characterizing the expected electrical impedance of the relay coil;

c. identifying, based electrical impedance determinations characterizing open contacts or closed contacts, the terminals that are connected to at least one pair of contacts;

d. causing a coil-energizing electrical current to flow between two of the electrical terminals that have been identified as coil terminals; and e. noting any difference in the impedance between terminals of the one pair of contacts.

2. A method according to claim 1, further comprising the step of indicating a failure of the relay to meet any of the operating characteristics of a functional relay.

3. A method according to claim 2, wherein said step of indicating a failure of the relay to meet any of the operating characteristics of a functional relay comprises:

a. determining if the impedance between any two terminals of the relay is within said arbitrarily-determined range of electrical impedance values characterizing the expected electrical impedance of the relay coil; and b. producing an error signal indicative of failure to find such an impedance value.

4. A method according to claim 2, wherein said step of indicating a failure of the relay to meet any of the operating characteristics of a functional relay comprises:

a. measuring the change of impedance between the contact terminals, that results from the flow of relay-energizing current through the coil; and b. producing an error signal indicative of failure to find a substantial change or such impedance.

5. A method according to claim 1, wherein the step of determining the electrical resistance between each terminal of the relay and every other terminal of the relay comprises:

a. sequentially attempting to pass an electrical current of a predetermined magnitude from each such terminal of the relay and every other terminal of the relay; and b. measuring the voltage across each such pair of terminals of the relay.

6. A method according to claim 1, further comprising the step of determining if there is a coil-suppression device connected in parallel with the coil terminals.

7. An apparatus according to claim 6 wherein said step of determining if there is a coil-suppression device connected in parallel with the relay coil comprises measuring the voltage across the coil terminals at a predetermined time after the application of electrical current to the coil.

8. An apparatus according to claim 7 wherein said means for measuring the voltage across the coil terminals at a predetermined time after the application of electrical current to the coil comprises:
   a. measuring the voltage at each terminal of the coil, with respect to a reference voltage; and
   b. subtracting the lower voltage measurement from the higher voltage measurement.

9. A method according to claim 6, further comprising the step of determining if the coil-suppression device has a polarity and, if so, determining the polarity of the coil-suppression device.

10. A method according to claim 1, wherein said step of causing a coil-energizing electrical current to flow between two of the electrical terminals that have been identified as coil terminals comprises:
    a. generating an electrical current of a predetermined magnitude; and
    b. switching the coil terminals of the relay such that said electrical current passes between said coil terminals.

11. A method according to claim 10, wherein said switching step comprises:
    a. connecting one of said coil terminals to accept a thus-generated electrical current; and
    b. connecting the other of said coil terminals to a common return path.

12. A method according to claim 1, further comprising:
    a. identifying the presence of a coil-suppression device connected in parallel with the relay coil; and
    b. producing a warning signal indicative of failure to find an operative coil-suppression device connected in parallel with the relay coil.

13. A method according to claim 12, wherein said step of identifying the presence of a coil-suppression device connected in parallel with the relay coil further comprises ascertaining if the coil-suppression device is non-polar or has poles.

14. A method according to claim 12, wherein said step of ascertaining if the coil-suppression device is non-polar or has poles comprises:
    a. passing an electrical current between the coil terminals first in one direction and then in the opposite direction; and
    b. determining if the voltage across the coil terminals differs depending upon the direction of current flow.

15. A method according to claim 1 further comprising indicating if the contacts of the relay, when closed, exhibit an electrical impedance in excess of a predetermined value.

16. A method according to claim 15 wherein said step of indicating if the contacts of the relay, when closed, exhibit an electrical impedance in excess of a predetermined value comprises:
    a. passing a substantial electrical current through said closed contacts; and
    b. sensing the voltage across said contacts.

17. A method according to claim 16 further comprising:
    a. repeatedly activating and deactivating said coil and repeating said voltage sensing at each repetition thereof; and
    b. countering the number, if any of failures to so exhibit an electrical impedance within an arbitrarily-determined range of impedance.

18. A method according to claim 16 wherein said step of sensing the voltage across said contacts comprises:
    a. measuring the voltage at each terminal of the contacts, with respect to a reference voltage; and
    b. subtracting the lower voltage measurement from the higher voltage measurement.

19. A method according to claim 18 further comprising:
    a. repeatedly activating and deactivating said coil and repeating said voltage sensing at each repetition thereof; and
    b. counting the number, if any of failures to so exhibit an electrical impedance within an arbitrarily-determined range of impedance.

20. Apparatus for automatically testing a relay having coil terminals and contact terminals, comprising:
    a. means for determining the electrical impedance between each terminal of the relay and every other terminal of the relay;
    b. means, based upon a determination that the electrical impedance between two of the terminals of said relay is within an arbitrarily-determined range of electrical impedance values characterizing the expected electrical impedance of the relay coil, for identifying the coil terminals;
    c. means, based upon a determination that the electrical impedance between at least two of the other terminals of said relay is of a value characterizing either open contacts or closed contacts for identifying the contact terminals of the relay;
    d. means for causing a relay-energizing electrical current to flow between the coil terminals;
    e. means for measuring the change of impedance between the contact terminals, that results from the flow of relay-energizing current through the coil; and
    f. means for indicating a failure of the relay to meet any of the operating characteristics of a functional relay.

21. An apparatus according to claim 20 wherein said means for determining the electrical impedance between each terminal of the relay and every other terminal of the relay comprises at least one current source and a plurality of electronic switches controlled to connect said current source sequentially to terminals of said relay and means for sensing the resulting voltage at each of said sequenced terminals.

22. An apparatus according to claim 21 wherein said current source comprises:
    a. at least one resistor;
    b. at least one switching device connected in series with said resistor, said resistor and switch being connected intermediately between a source of voltage and a terminal of said relay; and
    c. at least one of said plurality of electronic switches comprises a switch selectively connecting another terminal of said relay coil to a common electrical current return.

23. An apparatus according to claim 20 further comprising means for determining if there is a coil-suppression device connected in parallel with the coil terminals.

24. An apparatus according to claim 23 further comprising means for determining if the coil-suppression device has a polarity and, if so, determining the polarity of the coil-suppression device.

25. An apparatus according to claim 20 wherein said means for causing a relay-energizing electrical current to flow between the coil terminals comprises at least one current source and at least one electronic switch controlled to connect said current source to one coil terminal and to connect another coil terminal to a return path.

26. An apparatus according to claim 20 wherein said means for indicating a failure of the relay to meet any of the operating characteristics of a functional relay comprises:

a. means for determining if the impedance between any two terminals of the relay is within said arbitrarily-determined range of electrical impedance values characterizing the expected electrical impedance of the relay coil; and b. means for producing an error signal indicative of failure to find such an impedance value.

27. An apparatus according to claim 20 wherein said means for indicating a failure of the relay to meet any of the operating characteristics of a functional relay comprises: said means for measuring the change of impedance between the contact terminals, that results from the flow of relay-energizing current through the coil; and means for producing an error signal indicative of failure to find a substantial change of such impedance.

28. An apparatus according to claim 27 further comprising:

a. means for repeatedly causing the flow of relay-energizing current through the coil to occur and cease; and b. means for counting any such error signal(s).

29. An apparatus according to claim 20 further comprising: means for identifying the presence of a coil-suppression device connected in parallel with the relay coil; and means for producing a warning signal indicative of failure to find an operative coil-suppression device connected in parallel with the relay coil.

30. An apparatus according to claim 29 wherein said means for identifying the presence of a coil-suppression device connected in parallel with the relay coil comprises means for measuring the voltage across the coil terminals at a predetermined time after the application of electrical current to the coil.

31. An apparatus according to claim 30 wherein said means for measuring the voltage across the coil terminals at a predetermined time after the application of electrical current to the coil comprises:

a. measuring the voltage at each terminal of the coil, with respect to a reference voltage; and b. subtracting the lower voltage measurement from the higher voltage measurement.

32. An apparatus according to claim 29 wherein said means for identifying the presence of a coil-suppression device connected in parallel with the relay coil further comprises means for ascertaining if the coil-suppression device is non-polar or has poles.

33. An apparatus according to claim 32 wherein said means for ascertaining if the coil-suppression device is non-polar or has poles comprises:

a. means for passing an electrical current between the coil terminals first in one direction and then in the opposite direction; and b. means for determining if the voltage across the coil terminals differs depending upon the direction of current flow.

34. An apparatus according to claim 20 further comprising means for indicating if the contacts of the relay, when closed, exhibit an electrical impedance in excess of a predetermined value.

35. An apparatus according to claim 34 wherein said means for indicating if the contacts of the relay, when closed, exhibit an electrical impedance in excess of a predetermined value comprises:

a. means for passing a substantial electrical current through said closed contacts; and b. means for sensing the voltage across said contacts.

* * * * *